（12）United States Patent
Xiang et al.

(10) Patent No.: US 10,796,064 B2
(45) Date of Patent: Oct. 6, 2020

(54) AUTONOMOUS PLACEMENT TO SATISFY SELF-ALIGNED DOUBLE PATTERNING CONSTRAINTS

(71) Applicant: International Business Machines Corporation, Armonk, NY (US)

(72) Inventors: Hua Xiang, Ossining, NY (US); Gustavo Enrique Tellez, Essex Junction, VT (US); Shyam Ramji, Lagrangeville, NY (US); Gi-Joon Nam, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 144 days.

(21) Appl. No.: 16/103,011

(22) Filed: Aug. 14, 2018

(65) Prior Publication Data

US 2020/0057836 A1    Feb. 20, 2020

(51) Int. Cl.
*G06F 17/50* (2006.01)
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
CPC .............................. G06F 30/398; G06F 30/392
USPC .......................................................... 716/54
See application file for complete search history.

(56) References Cited

U.S. PATENT DOCUMENTS

| 9,245,076 | B2 | 1/2016 | Vassilios et al. | |
|---|---|---|---|---|
| 9,330,221 | B2 | 5/2016 | Yuan et al. | |
| 2003/0217338 | A1* | 11/2003 | Holmes | G06F 30/392 716/55 |
| 2013/0214433 | A1* | 8/2013 | Penzes | H01L 27/0207 257/786 |
| 2014/0282289 | A1* | 9/2014 | Hsu | G03F 7/70433 716/51 |
| 2014/0359548 | A1 | 12/2014 | Gerousis et al. | |

(Continued)

FOREIGN PATENT DOCUMENTS

| GB | 2522102 A | 7/2015 |
|---|---|---|
| TW | 201614531 A | 4/2016 |

OTHER PUBLICATIONS

Anonymous. "Methodology to improve SADP metal routability for lower technology nodes." IP.com. Dec. 18, 2017 . 5 pages.

(Continued)

*Primary Examiner* — Jack Chiang
*Assistant Examiner* — Brandon Bowers
(74) *Attorney, Agent, or Firm* — Amin, Turocy & Watson, LLP

(57) ABSTRACT

Techniques regarding functional placement of one or more logic gates in a periodic circuit row configuration are provided. For example, one or more embodiments described herein can comprise a system, which can comprise a memory that can store computer executable components. The system can comprise a processor, operably coupled to the memory, and that can execute the computer executable components stored in the memory. The computer executable components can comprise an optimization component, operatively coupled to the processor, that can determine functional placement of a logic gate in a self-aligned double patterning process that can form a periodic circuit row configuration.

20 Claims, 15 Drawing Sheets

(56) References Cited

U.S. PATENT DOCUMENTS

2015/0028489 A1 1/2015 Lei et al.
2015/0339428 A1 11/2015 Yuan et al.
2017/0277819 A1* 9/2017 Kim ..................... G06F 30/392
2018/0011961 A1 1/2018 Kwangok

OTHER PUBLICATIONS

Lin, Yibo, et al. "Detailed Placement in Advanced Technology Nodes: A Survey." Solid-State and Integrated Circuit Technology (ICSICT), 2016 13th IEEE International Conference on, pp. 836-839. 4 pages.
Ye, et al. "Standard Cell Layout Regularity and Pin Access Optimization Considering Middle-of-Line." Proceedings of the 25th edition on Great Lakes Symposium on VLSI, pp. 289-294. 2015. 6 pages.
Ahuja, Ravindra K., et al. "Finding minimum-cost flows by double scaling, Mathematical programming." 53, pp. 243-266, 1992. 24 pages.
Mell, Peter, et al. "The NIST Definition of Cloud Computing." National Institute of Standards and Technology, Sep. 2011. 7 pages.
Brenner, Ulrich, et al. "Almost Optimum Placement Legalization by Minimum Cost Flow and Dynamic Programming." International Symposium on Physical Design. 2004. 8 pages.
Brenner, et al. "Faster Optimal Single-Row Placement with Fixed Ordering." In Proceedings Design, Automation and Test in Europe Conference and Exhibition, 2000. 5 pages.
Brenner, Ulrich, et al. "Legalizing a placement with Minimum Total Movement." IEEEE Transactions on Computer-Aided Design of Integrated Circuits and Systems, vol. 23 (12), pp. 1597-1613. Dec. 2004. 17 pages.
Chen, Tung-Chieh, et al. "NTUplace3: An Analytical Placer for Large-Scale Mixed-Size Designs With Preplaced Blocks and Density Constraints." IEEE TCAD Integrated Circuits and Systems, 27(7):1228-1240, Jul. 2008. 13 pages.
Cho, Misik, et al. "History-based VLSI Legalization using Network Flow." pp. 286-291, Proceedings of the 47th Design Automation Conference on DAC. 2010. 6 pages.
Cormen, Thomas, H., et al. "Introduction to Algorithms, Second Edition". The MIT press. 2001. 984 pages.
Dobre, Sorin, et al. "Mixed Cell-Height Implementation for Improved Design Quality in Advanced Nodes." IEEE/ACM International Conference on Computer-Aided Design (ICCAD). 2015, pp. 854-860. 7 pages.
Doll, Konrad, et al. "Iterative Placement Improvement by Network Flow Methods." IEEE Transactions on Computer-Aided Design of Integrated Circuits and Systems, vol. 13, No. 10, 1994. 12 pages.
Hur, Sung-Woo, et al. "Mongrel: Hybrid Techniques for Standard Cell Placement." Proc. Int. Conf. on Computer Aided Design, 2000. 6 pages.
Kahng, Andrew B., et al. "Optimization of Linear Placements for Wirelength Minimization with Free Sites." Proceedings of the ASP-DAC '99 Asia and South Pacific Design Automation Conference. 1999. 4 pages.
Kodama, Chikaaki, et al. "Self-Aligned Double and Quadruple Patterning-Aware Grid Routing with Hotspots Control." 18th Asia and South Pacific Design Automation Conference (ASP-DAC). 2013. 6 pages.
Ren, Haoxing, et al. "Diffusion-Based Placement Migration." Proceedings of the 42nd Annual Conference on Design Automation. 2005. 6 pages.
Spindler, Peter, et al. "Abacus: Fast Legalization of Standard Cell Circuits with Minimal Movement." ISPD2008. 7 Pages.
Gao, Jhih-Rong, et al. "Self-Aligned Double Patterning Friendly Configuration for Standard Cell Library Considering Placement." Proc. of SPIE vol. 8684, 868406. 10 pages.
Yu, Bei, et al. "Methodology for Standard Cell Compliance and Detailed Placement for Triple Patterning Lithography", IEEE Transactions on Computer-Aided Design of Integrated Circuits and Systems, vol. 34, No. 5, May 2015. 15 pages.
Ou, Hung-Chih, et al. "Cutting Structure-Aware Analog Placement Based on Self-Aligned Double Patterning with E-Beam Lithography." DAC 2015. 6 pages.
Ahuja, Ravindra K., et al. "Network Flows: Theory, Algorithms, and Applications." Prentice Hall, 1993. 863 pages. pp. 1-100.
Ahuja, Ravindra K., et al. "Network Flows: Theory, Algorithms, and Applications." Prentice Hall, 1993. 863 pages. pp. 101-200.
Ahuja, Ravindra K., et al. "Network Flows: Theory, Algorithms, and Applications." Prentice Hall, 1993. 863 pages. pp. 201-300.
Ahuja, Ravindra K., et al. "Network Flows: Theory, Algorithms, and Applications." Prentice Hall, 1993. 863 pages. pp. 301-400.
Ahuja, Ravindra K., et al. "Network Flows: Theory, Algorithms, and Applications." Prentice Hall, 1993. 863 pages. pp. 401-500.
Ahuja, Ravindra K., et al. "Network Flows: Theory, Algorithms, and Applications." Prentice Hall, 1993. 863 pages. pp. 501-600.
Ahuja, Ravindra K., et al. "Network Flows: Theory, Algorithms, and Applications." Prentice Hall, 1993. 863 pages. pp. 601-700.
Ahuja, Ravindra K., et al. "Network Flows: Theory, Algorithms, and Applications." Prentice Hall, 1993. 863 pages. pp. 701-800.
Ahuja, Ravindra K., et al. "Network Flows: Theory, Algorithms, and Applications." Prentice Hall, 1993. 863 pages. pp. 801-863.

* cited by examiner

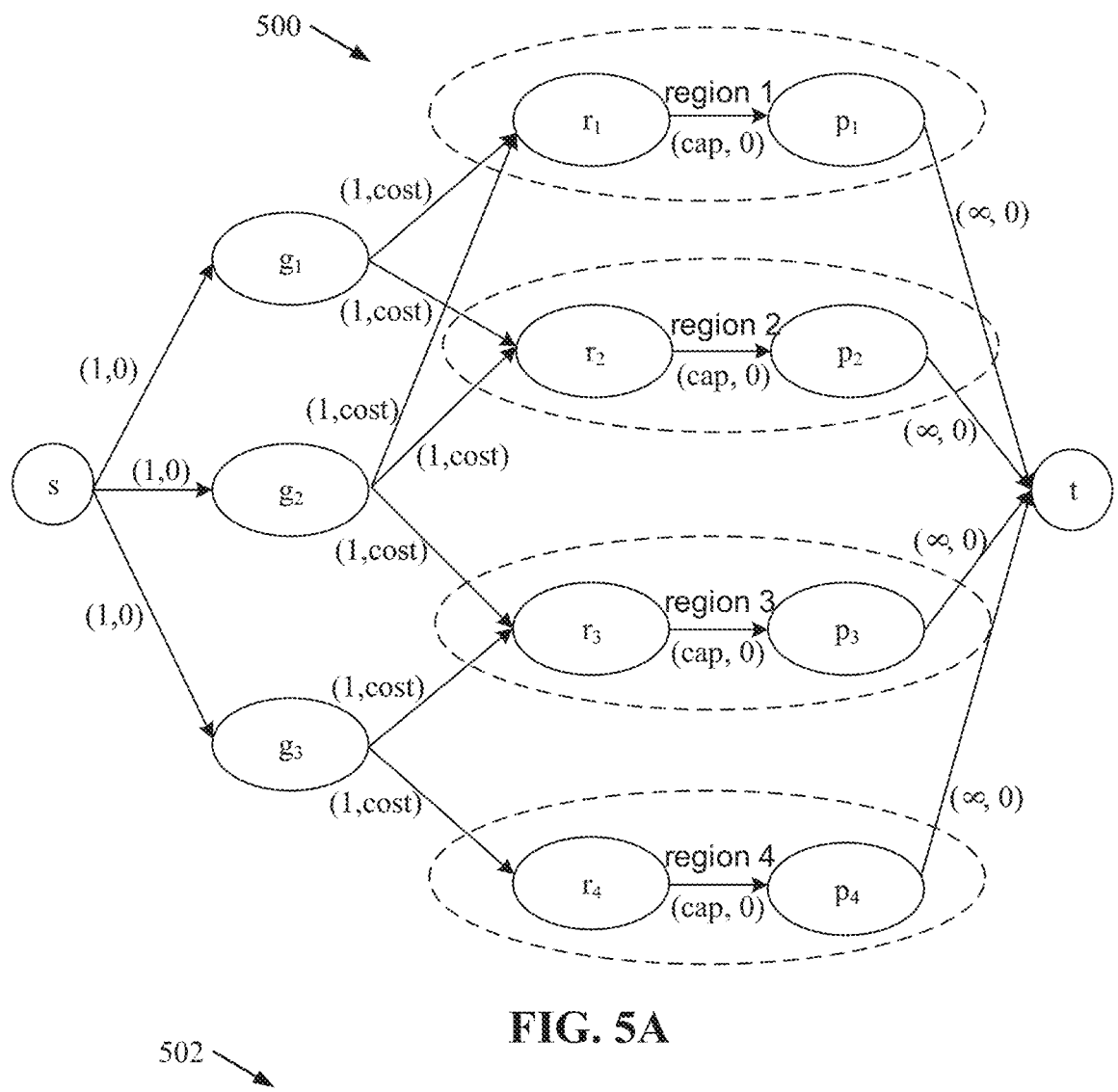

FIG. 5A

Algorithm Region_Assignment_from_Average_Gatewidth_Flow()
For each edge $e = (g, r) \in E_g$
1. If there is no flow on $e$, continue;
2. Add $g$ into the candidate list of $r$;

For each region $r$
1. If the width of all candidates $\leq (R_{width} - R_{used})$
2. Then assign all candidates to $r$;
3. Else sort candidates with decreasing logic gate width
4.    loop candidates from the largest width
      If a candidate can fit in $r$, then assign it to $r$

Algorithm Swapping_Group_Selection (int $g_{num}$, int $g_{wd}$, region $r$)
1. Enumerate groups whose gate number is less than $g_{num}$;
2. For each group $g$,
3.    If ($g_{width} > g_{wd}$), remove $g$ from the list;
4.    If (($g_{width} < g_{wd}$)&&($r_{empty} \leq g_{wd} - g_{width}$)), remove $g$;
5.    $g_{empty} = g_{wd} - g_{width}$;
6. Sort group list based on ave_group_movement_cost;
7.
8. SelectedGroups = { }
9. SelectedGates = { }
10. UsedEmptySpace = 0
11. For $g$ in the group list
12.    If (UsedEmptySpace + $g_{empty} < r_{empty}$)
13.       If (all gates in $g$ do not appear in SelectedGates)
14.          Add $g$ into SelectedGroups;
15.          Add all gates in $g$ into SelectedGates;
16.          UsedEmptySpace += $g_{empty}$;
17.
18. Return SelectedGroup

Algorithm Flow_based_region_assignment_with_swapping_groups()
1. Build gate buckets based on gate widths;
2. Sort buckets with decrease gate widths;
3. For each bucket
3.1.   Let the max gate width of the bucket be $G_w$.
3.2.   For (iter=1; iter<iter_threshold; iter ++)
3.2.1     Identify swapping groups for each gate in the bucket;
3.2.2     Build graph with (x_range, row_range, groups)
3.2.3     Apply min-cost max-flow algorithm;
3.2.4     Assign gates based on the flow;
3.2.5     Remove assigned gates from the bucket;
3.2.6     Insert unassigned group gates into the buckets;
3.2.7     If the bucket is empty, break;
3.2.8     Increase row_range or x_range;
3.2.9     If row_range and x_range reach the threshold,break;

Design Information

| Test | ChipSize ($um^2$) | Total Gates | Logic Gate 110 | | FixedGates | |
|---|---|---|---|---|---|---|
| | | | Num | Percent | Num | Percent |
| Design1 | 235.52x115.20 | 21122 | 3655 | 17.30% | 7414 | 35.10% |
| Design2 | 163.84x115.20 | 17923 | 2680 | 14.95% | 4842 | 27.02% |
| Design3 | 153.60x230.40 | 36934 | 6415 | 17.37% | 4626 | 12.53% |
| Design4 | 209.92x220.16 | 53755 | 7796 | 14.50% | 6073 | 11.30% |
| Design5 | 163.84x186.88 | 31459 | 3952 | 12.56% | 4486 | 14.26% |
| Design6 | 199.68x135.68 | 12026 | 828 | 6.89% | 3312 | 27.54% |
| Design7 | 235.52x261.12 | 58637 | 7411 | 12.64% | 6772 | 11.55% |
| Design8 | 307.20x240.64 | 89345 | 3037 | 3.40% | 10757 | 12.04% |
| Design9 | 222.72x281.60 | 62742 | 7253 | 11.56% | 6471 | 10.31% |
| Design10 | 204.80x138.24 | 44059 | 2094 | 4.75% | 2861 | 6.49% |
| Design11 | 163.84x320.00 | 55564 | 4504 | 8.11% | 4694 | 8.45% |
| Design12 | 133.12x143.36 | 16173 | 1660 | 10.26% | 3564 | 22.04% |
| Design13 | 97.28x435.20 | 41436 | 2937 | 7.09% | 5843 | 14.10% |

TWL Comparison

| Test | Original | Second Analysis Approach | | System 200 Approach | |
|---|---|---|---|---|---|
| | | TWL | IncPer | TWL | IncPer |
| Design1 | 3820553 | 4580032 | 19.88% | 3903583 | 2.17% |
| Design2 | 2316156 | 3064601 | 32.31% | 2389950 | 3.19% |
| Design3 | 8291986 | 10733032 | 29.44% | 8550358 | 3.12% |
| Design4 | 9804721 | 14063315 | 43.43% | 10186344 | 3.89% |
| Design5 | 5108608 | 6963491 | 36.31% | 5355238 | 4.83% |
| Design6 | 2432549 | 2796101 | 14.95% | 2471108 | 1.59% |
| Design7 | 13046947 | 17229130 | 32.05% | 13287153 | 1.84% |
| Design8 | 17270284 | 20841892 | 20.68% | 17683274 | 2.39% |
| Design9 | 14919907 | 18690843 | 25.27% | 15203571 | 1.90% |
| Design10 | 6511903 | 9037735 | 38.79% | 6863351 | 5.40% |
| Design11 | 9814958 | 13584808 | 38.41% | 10173947 | 3.66% |
| Design12 | 3356038 | 4126053 | 22.94% | 3428483 | 2.16% |
| Design13 | 8180818 | 10020393 | 22.49% | 8328011 | 1.80% |
| Ave | | | 29.42% | | 2.81% |

Comparison Results on Average Location Change and RunTime

| Test | Average | | | Runtime (s) | |
|---|---|---|---|---|---|
| | 1ST | 2ND | DiffPer | 1ST | 2ND |
| Design1 | 1918.66 | 1789.41 | -6.74% | 0.82 | 1.04 |
| Design2 | 2001.57 | 1608.70 | -19.63% | 1.81 | 0.9 |
| Design3 | 3592.65 | 2073.43 | -42.29% | 5.79 | 3.36 |
| Design4 | 4135.80 | 1945.19 | -52.97% | 6.85 | 3.57 |
| Design5 | 3043.34 | 1778.76 | -41.55% | 4.96 | 3.15 |
| Design6 | 1814.65 | 1394.88 | -23.13% | 0.59 | 0.96 |
| Design7 | 4033.29 | 1545.62 | -61.68% | 7.1 | 4.72 |
| Design8 | 2051.68 | 1623.52 | -20.87% | 17.63 | 6.85 |
| Design9 | 3419.30 | 1488.15 | -56.48% | 8.06 | 5.14 |
| Design10 | 2926.38 | 2052.84 | -29.85% | 4.66 | 3.32 |
| Design11 | 3347.01 | 1554.32 | -53.56% | 5.23 | 4.76 |
| Design12 | 2706.16 | 1716.09 | -36.59% | 1.46 | 1.08 |
| Design13 | 2480.95 | 1368.35 | -44.85% | 3.41 | 2.68 |
| Ave | | | -41.45% | 5.41 | 3.19 |

1104

Comparison Results on Gate Max location change

| Test | Logic Gates 110 | | | Logic Gates 108 | | |
|---|---|---|---|---|---|---|
| | 1ST | 2ND | Diff | 1ST | 2ND | Diff |
| Design1 | 39680 | 15680 | -60.48% | 20080 | 19680 | -1.99% |
| Design2 | 42240 | 16080 | -61.93% | 20960 | 16880 | -19.47% |
| Design3 | 60240 | 29200 | -51.53% | 24000 | 16960 | -29.33% |
| Design4 | 104400 | 23840 | -77.16% | 46320 | 14960 | -67.70% |
| Design5 | 49360 | 22480 | -54.46% | 36720 | 16800 | -54.25% |
| Design6 | 30240 | 9680 | -67.99% | 19840 | 16720 | -15.73% |
| Design7 | 81040 | 25280 | -68.81% | 61680 | 13760 | -77.69% |
| Design8 | 38880 | 16640 | -57.20% | 45600 | 23360 | -48.77% |
| Design9 | 86800 | 18240 | -78.99% | 47360 | 19440 | -58.95% |
| Design10 | 71200 | 18000 | -74.72% | 64240 | 27200 | -57.66% |
| Design11 | 61440 | 20960 | -65.89% | 75840 | 13360 | -82.38% |
| Design12 | 60240 | 18480 | -69.32% | 32320 | 17840 | -44.80% |
| Design13 | 54160 | 19200 | -64.55% | 36400 | 14400 | -60.44% |
| Ave | | | -67.46% | | | -56.46% |

1202 — DETERMINING, BY A SYSTEM OPERATIVELY COUPLED TO A PROCESSOR, FUNCTIONAL PLACEMENT OF A LOGIC GATE IN A SADP PROCESS THAT FORMS A PERIODIC CIRCUIT ROW CONFIGURATION

1204 — DETERMINING, BY THE SYSTEM, THE FUNCTIONAL PLACEMENT USING A MINIMUM COST MAXIMUM FLOW ALGORITHM

US 10,796,064 B2

AUTONOMOUS PLACEMENT TO SATISFY SELF-ALIGNED DOUBLE PATTERNING CONSTRAINTS

BACKGROUND

The subject disclosure relates to autonomous placement to satisfy one or more self-aligned double patterning constraints, and more specifically, to the autonomous placement of one or more logic gates in a self-aligned double patterning process to meet one or more operational constraints.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatuses and/or computer program products that can determine the functional placement of one or more logic gates in a periodic circuit row configuration are described.

According to an embodiment, a system is provided. The system can comprise a memory that can store computer executable components. Also, the system can comprise a processor that can execute the computer executable components stored in the memory. Further, the computer executable components can comprise an optimization component, operatively coupled to the processor, that can determine functional placement of a logic gate in a self-aligned double patterning process that can form a periodic circuit row configuration.

According to an embodiment, a computer-implemented method is provided. The computer-implemented method can comprise determining, by a system operatively coupled to a processor, functional placement of a logic gate in a self-aligned double patterning process that can form a periodic circuit row configuration. The periodic circuit row configuration can comprise a first circuit row and a second circuit row. Also, a first thickness of a first wire track comprised within the first circuit row can be different than a second thickness of a second wire track comprised within the second circuit row.

According to an embodiment, a computer program product that can autonomously optimizes placement of a logic gate is provided. The computer program product can comprise a computer readable storage medium having program instructions embodied therewith. The program instructions can be executable by a processor to cause the processor to determine, by a system operatively coupled to the processor, functional placement of the logic gate in a self-aligned double patterning process that can form a periodic circuit row configuration. The periodic circuit row configuration can comprise a first circuit row and a second circuit row. Also, a first thickness of a first wire track comprised within the first circuit row can be different than a second thickness of a second wire track comprised within the second circuit row.

BRIEF DESCRIPTION OF THE DRAWINGS

FIG. 5A illustrates a diagram of an example, non-limiting flow network graph that can be generated by one or more systems to facilitate determining the functional placement of one or more logic gates in a self-aligned double patterning process in accordance with one or more embodiments described herein.

FIG. 5B illustrates a diagram of an example, non-limiting assignment algorithm that can be implemented by one or more systems to facilitate determining the functional placement of one or more logic gates in a self-aligned double patterning process in accordance with one or more embodiments described herein.

FIG. 6A illustrates a diagram of an example, non-limiting group selection algorithm that can be implemented by one or more systems to facilitate determining the functional placement of one or more logic gates in a self-aligned double patterning process in accordance with one or more embodiments described herein.

FIG. 6B illustrates a diagram of an example, non-limiting reassignment algorithm that can be implemented by one or more systems to facilitate determining the functional placement of one or more logic gates in a self-aligned double patterning process in accordance with one or more embodiments described herein.

FIG. 9 illustrates a diagram of an example, non-limiting table that can depict the efficacy of one or more systems that can autonomously determine the functional placement of one or more logic gates in a periodic circuit row configuration in accordance with one or more embodiments described herein.

FIG. 10 illustrates a diagram of an example, non-limiting table that can depict the efficacy of one or more systems that can autonomously determine the functional placement of one or more logic gates in a periodic circuit row configuration in accordance with one or more embodiments described herein.

FIG. 11 illustrates a diagram of example, non-limiting tables that can depict the efficacy of one or more systems that can autonomously determine the functional placement of one or more logic gates in a periodic circuit row configuration in accordance with one or more embodiments described herein.

DETAILED DESCRIPTION

Figure 1:
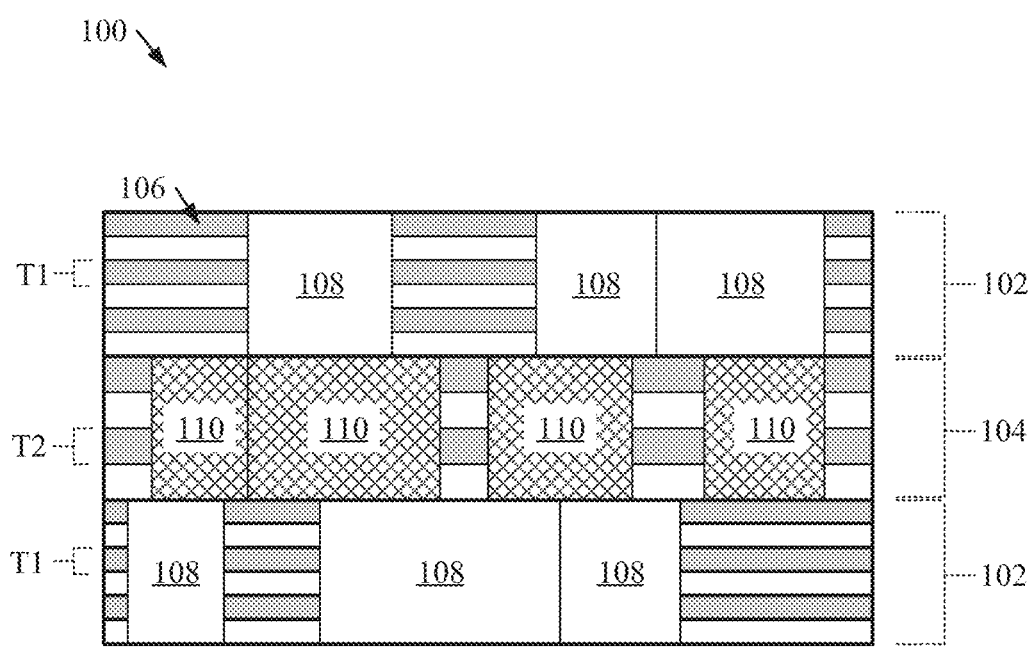
FIG. 1 illustrates a diagram of an example, non-limiting periodic circuit row configuration that can be achieved using a self-aligned double patterning process in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. Further, amongst the various drawings, common features, materials, and/or properties can be depicted with common crosshatching and/or shading in accordance with one or more embodiments described herein.

Double patterning is used to design circuits at the sub-22 nanometer (nm) technology node. Among various double patterning techniques, self-aligned double patterning ("SADP") can form a wafer image by single exposure followed by sidewall spacer processes for improved overlay controllability. Based on SADP, a new set of standard logic gates have been developed using thicker metal wires for stronger drive strength. By applying these thicker logic gates on critical pathways, design performance can be improved. However, mixed circuit designs, comprising conventional logic gates and thicker logic gates, require the thicker logic gates to be placed on circuit rows with thicker metal wires than those used for conventional logic gates. In other words, the introduction of thicker logic gates along with conventional logic gates necessitates one or more operational constraints, wherein conventional logic gates are positioned on circuit rows comprising conventional wires and thicker, non-conventional, logic gates are positioned on circuit rows comprising thicker wires (e.g., as compared to conventional wires).

Various embodiments of the present invention can be directed to computer processing systems, computer-implemented methods, apparatus and/or computer program products that facilitate the efficient, effective, and autonomous (e.g., without direct human guidance) placement of one or more logic gates to meet one or more operational constraints using one or more SADP processes. For example, one or more embodiments described herein can comprise a two-stage process to facilitate achieving optimal logic gate placement, wherein logic gates can be autonomous positioned onto circuit rows that can meet the respective operational constraints of the logic gates. For instance, one or more embodiments described herein can utilize one or more minimum cost maximum flow ("min-cost max-flow") algorithms to determine the functional and/or optimal placement of one or more logic gates in a SADP process that forms one or more periodic circuit row configurations.

The computer processing systems, computer-implemented methods, apparatus and/or computer program products employ hardware and/or software to solve problems that are highly technical in nature (e.g., autonomous placement of one or more logic gates in a periodic circuit row configuration), that are not abstract and cannot be performed as a set of mental acts by a human. For example, an individual, or even a plurality of individuals, cannot determine the functional and/or optimal placement of multiple logic gates with the degree of accuracy, speed, and/or efficiency demonstrated by the various embodiments described herein. Further, the nature of SADP processes are inherently directed to alleviating the need for human interference to leverage various advantages of autonomous systems (e.g., increased efficiency) while also minimizing human error.

FIG. 1 illustrates a diagram of an example, non-limiting periodic circuit row configuration 100 comprising one or more logic gates located in functional and/or optimal positions via a SADP process in accordance with one or more embodiments described herein. Repetitive description of like elements employed in other embodiments described herein is omitted for sake of brevity.

As shown in FIG. 1, a periodic circuit row configuration 100 can comprise a plurality of circuit rows. While FIG. 1 depicts three circuit rows, the architecture of the periodic circuit row configuration 100 is not so limited. For example, one of ordinary skill in the art will readily recognize that period circuit row configurations 100 can comprise two or more circuit rows (e.g., 2 to 6 circuit rows). Further, the periodic circuit row configuration 100 can comprise two or more types of circuit rows. For example, FIG. 1 depicts a periodic circuit row configuration 100 comprising two types of circuit rows: one or more first type of circuit rows 102 and/or one or more second type of circuit rows 104. While FIG. 1 depicts two distinctive types of circuit rows, the architecture of the periodic circuit row configuration 100 is not so limited. For example, one of ordinary skill in the art will readily recognize that periodic circuit row configurations 100 can comprise three or more distinctive circuit row types. Moreover, in various embodiments adjacent circuit rows can be characterized by different types. For example, one or more circuit rows adjacent to a first type of circuit row 102 can be second type of circuit rows 104. Similarly, one or more circuit rows adjacent to a second type of circuit row 104 can be first type circuit rows 102.

In one or more embodiments, the distinctive circuit row types (e.g., the first type of circuit row 102 and/or the second type of circuit row 104) can be characterized by different wire track 106 thickness. For example, the one or more first type of circuit rows 102 can comprise thicker wire tracks 106 (e.g., metal wires) than the one or more second type of circuit rows 104. For instance, the one or more first type of circuit rows 102 can comprise wire tracks 106 characterized by having a thickness of, for example, 20 nm. In another instance, the one or more second type of circuit rows 104 can comprise wire tracks 106 characterized by having a thickness of, for example, 100 nm. For example, FIG. 1 depicts the one or more first type of circuit rows 102 as having wire tracks 106 of a first thickness ("T1") and the one or more second type of circuit rows 104 as having wire tracks 106 of a second thickness ("T2"), wherein T2 can be greater than T1.

As shown in FIG. 1, a circuit row can comprise multiple wire tracks 106. Further, one of ordinary skill in the art will recognize that the number of wire tracks 106 per circuit row depicted in FIG. 1 is exemplary, and the architecture of the circuit rows is not so limited. For instance, the first type of circuit row 102 can comprise seven or more wire tracks, each with the same or similar "T1" thickness. Additionally, the second type of circuit row 104 can have 3 or 5 wire tracks 106, wherein the wire tracks 106 can be characterized by the same thickness (e.g., "T2") or a plurality of thickness. Thus, a circuit row (e.g., the second type of circuit row 104) can comprise a first wire track 106 and a second wire track 106, wherein the first wire track 106 and second wire track 106 can have different thickness. Moreover, in one or more embodiments, one or more of the wire tracks 106 comprising the second type of circuit row 104 can be thicker than wire tracks 106 comprising the first type of circuit row 102. Further, the height of the circuit rows comprising the periodic circuit row configuration 100 can be the same; thus, the different types of circuit rows can be characterized as comprising a different number of wire tracks 106. For example, the one or more second type of circuit rows 104 can be characterized as comprising less wire tracks 106 than the first type of circuit rows 102, wherein both types of circuit rows have the same height. Wherein a circuit row comprises less wire tracks 106 than another circuit row but has the same height, then one or more of the wire tracks 106 comprising the circuit row with less wire tracks 106 can be thicker than one or more of the wire tracks 106 comprising the circuit row with more wire tracks 106.

In one or more embodiments, the periodic circuit row configuration 100 can comprise two or more distinct types of logic gates. For example, FIG. 1 depicts a periodic circuit row configuration 100 comprising two types of logic gates: one or more first type of logic gates 108 and/or one or more second type of logic gates 110. While FIG. 1 depicts two distinctive types of logic gates, the architecture of the periodic circuit row configuration 100 is not so limited. For example, one of ordinary skill in the art will readily recognize that periodic circuit row configurations 100 can comprise three or more distinctive logic gates.

For example, the one or more first type of logic gates 108 can be characterized by one or more operational constraints that can define the type of circuit row that can facilitate functionality of the one or more first type of logic gates 108. For instance, the first type of logic gates 108 can be functional when placed on one or more of the first type of circuit rows 102, and not functional when placed on one or more of the second type of circuit rows 104. Similarly, the one or more second type of logic gates 110 can be characterized by one or more operational constraints that can define the type of circuit row that can facilitate functionality of the one or more second type of logic gates 110. For instance, the second type of logic gates 110 can be functional when placed on one or more of the second type of circuit rows 104, and not functional when placed on one or more of the first type of circuit rows 102.

For example, the periodic circuit row configuration 100 depicted in FIG. 1 is optimized to increase functionality by comprising a plurality of logic gates (e.g., one or more first type of logic gates 108 and/or one or more second type of logic gates 110), each of which are positioned on functional circuit rows in accordance with respective operational constraints. For instance, wherein the one or more first type of logic gates 108 are functional on the one or more first type of circuit rows 102, the periodic circuit row configuration 100 can be optimized such that the first type of logic gates 108 are positioned on the one or more first types of circuit rows 102 (e.g., as shown in FIG. 1). Similarly, wherein the one or more second type of logic gates 110 are functional on the one or more second type of circuit rows 104, the periodic circuit row configuration 100 can be optimized such that the second type of logic gates 110 are positioned on the one or more second types of circuit rows 104 (e.g., as shown in FIG. 1).

Figure 2:
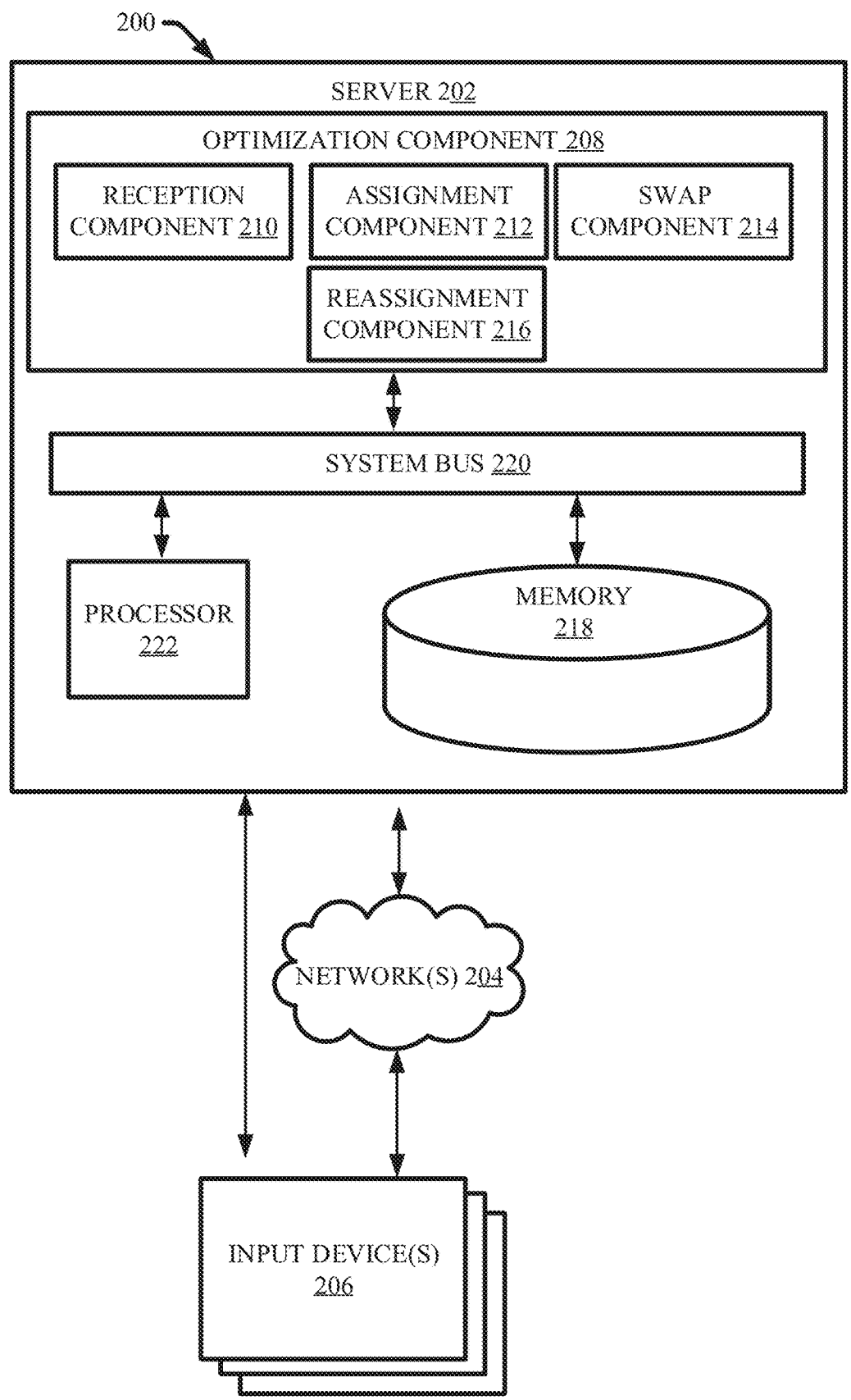
FIG. 2 illustrates a block diagram of an example, non-limiting system that can facilitate determining the functional placement of one or more logic gates in a self-aligned double patterning process that can form a periodic circuit row configuration in accordance with one or more embodiments described herein.

FIG. 2 illustrates a block diagram of an example, non-limiting system 200 that can facilitate autonomous placement of one or more logic gates in one or more periodic circuit row configurations 100 in one or more SADP processes in accordance with one or more embodiments described herein. Repetitive description of like elements employed in other embodiments described herein is omitted for sake of brevity. Aspects of systems (e.g., system 200 and the like), apparatuses or processes in various embodiments of the present invention can constitute one or more machine-executable components embodied within one or more machines, e.g., embodied in one or more computer readable mediums (or media) associated with one or more machines. Such components, when executed by the one or more machines, e.g., computers, computing devices, virtual machines, etc. can cause the machines to perform the operations described.

As shown in FIG. 2, the system 200 can comprise one or more servers 202, one or more networks 204, and/or one or more input devices 206. The server 302 can comprise optimization component 208. The optimization component 208 can further comprise reception component 210, assignment component 212, swap component 214, and/or reassignment component 216. Also, the server 202 can comprise or otherwise be associated with at least one memory 218. The server 302 can further comprise a system bus 220 that can couple to various components such as, but not limited to, the optimization component 208 and associated components, memory 218 and/or a processor 222. While a server 202 is illustrated in FIG. 2, in other embodiments, multiple devices of various types can be associated with or comprise the features shown in FIG. 2. Further, the server 202 can communicate with one or more cloud computing environments via the one or more networks 204.

The one or more networks 204 can comprise wired and wireless networks, including, but not limited to, a cellular network, a wide area network (WAN) (e.g., the Internet) or a local area network (LAN). For example, the server 202 can communicate with the one or more servers 202 and/or the one or more input devices 206 (and vice versa) using virtually any desired wired or wireless technology including for example, but not limited to: cellular, WAN, wireless fidelity (Wi-Fi), Wi-Max, WLAN, Bluetooth technology, a combination thereof, and/or the like. Further, although in the embodiment shown the optimization component 208 can be provided on the one or more servers 202, it should be appreciated that the architecture of system 200 is not so limited. For example, the optimization component 208, or one or more components of optimization component 208, can be located at another computer device, such as another server device, a client device, etc.

The one or more input devices 206 can comprise one or more computerized devices, which can include, but are not limited to: personal computers, desktop computers, laptop computers, cellular telephones (e.g., smart phones), computerized tablets (e.g., comprising a processor), smart watches, keyboards, touch screens, mice, a combination thereof, and/or the like. A user of the system 200 can utilize the one or more input devices 206 to input data into the system 200, thereby sharing (e.g., via a direct connection and/or via the one or more networks 204) the data with the server 202. For example, the one or more input devices 206 can send data to the reception component 210 (e.g., via a direct connection and/or via the one or more networks 204). For instance, inputted data can comprise one or more initial periodic circuit row configurations 100, one or more parameters regarding one or more periodic circuit row configurations 100, one or more operational constraints regarding one or more logic gates, a combination thereof, and/or the like. Additionally, the one or more input devices 206 can comprise one or more displays that can present one or more outputs generated by the system 200 to a user. For example, the one or more displays can include, but are not limited to: cathode tube display ("CRT"), light-emitting diode display ("LED"), electroluminescent display ("ELD"), plasma display panel ("PDP"), liquid crystal display ("LCD"), organic light-emitting diode display ("OLED"), a combination thereof, and/or the like.

In one or more embodiments, the optimization component 208 can perform a two-stage legalization algorithm to facilitate relocation of one or more mismatched logic gates placed in one or more periodic circuit row configurations 100 by one or more SDAP processes. The relocation can regard moving one or more logic gates to functional positions within the one or more periodic circuit row configurations 100 based on one or more respective operational constraints of the logic gates. For example, in various embodiments the optimization component 208 can utilize one or more min-cost max-flow algorithms to determine the functional placement of one or more mismatched logic gates. As used herein, the term "mismatched logic gate" can refer to a logic gate (e.g., a first type of logic gate 108 or a second type of logic gate 110) located in a position in a periodic circuit row configuration 100 that is in conflict with one or more of the logic gate's respective operational constraints. For example, wherein a first type of logic gate 108 has an operational constraint that limits the logic gate's functionality to first type of circuit rows 102 and the first type of logic gate 108 is located on a second type of circuit row 104, the subject first type of logic gate 108 can be considered to be a mismatched logic gate. An additional operational constraint can include the amount of available space on a circuit row that a logic gate requires for placement. Moreover, in one or more embodiments, the optimization component 208 can determine one or more swapping techniques to address logic gate assignment in congested regions of the one or more periodic circuit row configurations 100.

The reception component 210 can receive data inputted into the system 200. For example, the reception component 210 can receive data from the one or more input devices 206. The reception component 210 can be operably coupled to the one or more input devices 206 directly (e.g., via an electrical connection) and/or indirectly (e.g., via the one or more networks 204). Also, the reception component 210 can be operably coupled to one or more cloud computing environments via the one or more networks 204. Additionally, the reception component 210 can be operably coupled to any of the server's 202 associated components (e.g., the assignment component 212, the swap component 214, the reassignment component 216, the memory 218, the system bus 220, and/or the processor 222).

Figure 3:
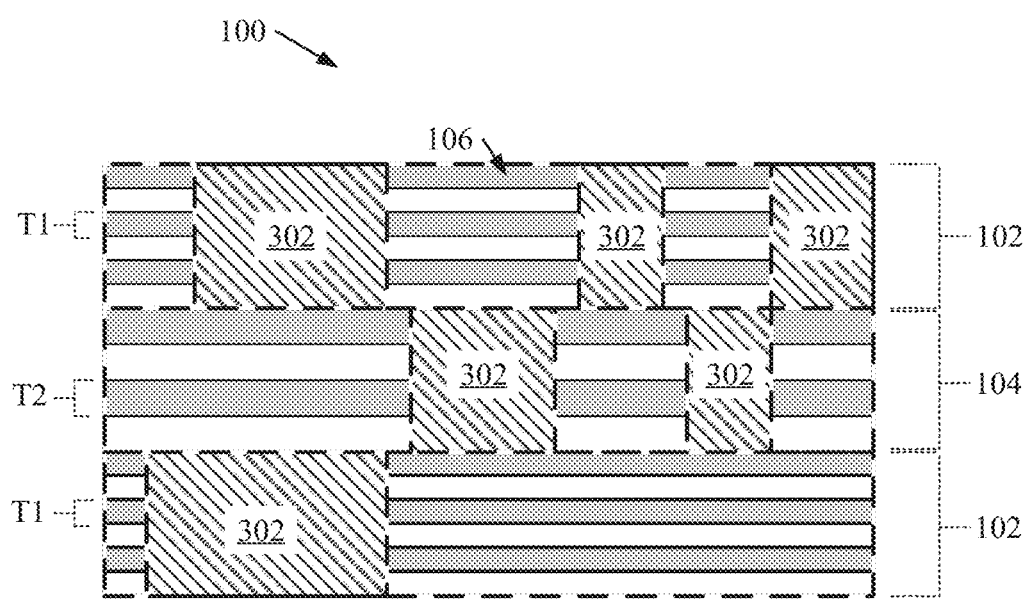
FIG. 3 illustrates a diagram of an example, non-limiting circuit row configuration onto which one or more logic gates can be placed using a self-aligned double patterning process in accordance with one or more embodiments described herein.

FIG. 3 illustrates a diagram of an example, non-limiting periodic circuit row configuration 100 onto which the system 200 can determine the functional positioning of one or more logic gates in one or more SADP processes in accordance with one or more embodiments described herein. Repetitive description of like elements employed in other embodiments described herein is omitted for sake of brevity. As shown in FIG. 3, the one or more periodic circuit row configurations 100 can comprise one or more fixed objects 302, such as pre-placed logic gates, logon control blocks ("LCB"), latches, preplaced macros, a combination thereof, and/or the like. In one or more embodiments, the fixed objects 302 can represent any objects the designers of the one or more periodic circuit row configurations 100 do not want relocated. The one or more fixed objects 302 can partition the one or more circuit rows into one or more discontinuous available regions (e.g., represented by dashed lines in FIG. 3).

One or more SADP processes can place one or more logic gates into the one or more available regions. Traditional SADP processes can determine the placement of one or more logic gates based on size requirements of the respective logic gates and/or the size of the available regions. However, traditional SADP processes can neglect to consider operational constraints other than size requirements. For example, operational constraints regarding which type of circuit row facilitates functionality of a subject logic gate are not considered by traditional SADP processes. Thus, traditional SADP processes can create one or more periodic circuit row configurations 100 comprising one or more logic gates placed to fit within one or more available regions, but one or more of the logic gates can be mismatched logic gates.

In one or more embodiments, a user of the system 200 can utilize one or more SADP processes to create one or more initial periodic circuit row configurations 100. Further, the user can input the one or more initial periodic circuit row configurations 100 into the system 200 via the one or more input devices 206 and/or the one or more networks 204. Further, the reception component 210 can receive the one or more initial periodic circuit row configurations 100 for analysis by the optimization component 208.

In one or more embodiments, a user of the system 200 can input one or more parameters of a subject periodic circuit row configuration 100. Example parameters can include, but are not limited to: a number of circuit rows, the types of circuit rows, a number of logic gates, respective operational constraints of the logic gates, a number of fixed objects 302, respective sizes of fixed objects 302, location of fixed objects 302, a combination thereof, and/or the like. The user can input the one or more parameters into the system 200 via the one or more input devices 206 and/or the one or more networks 204. Further, the reception component 210 can receive the one or more initial periodic circuit row configurations 100 for analysis by the optimization component 208, wherein the optimization component 208 can generate one or more initial periodic circuit row configurations 100 using one or more SADP processes based on, for example, the size and/or location of available regions.

Thus, the one or more initial periodic circuit row configurations 100 can be inputted into the system 200 and/or created by the system 200. Although the one or more initial periodic circuit row configurations 100 can comprise no overlap among logic gates, the one or more SADP processes can create one or more mismatched logic gates. For example, the one or more SADP processes can create one or more initial periodic circuit row configurations 100 comprising one or more logic gates positioned on incompatible circuit rows, as defined the respective operational constraints of the one or more logic gates.

For each available region of the one or more initial periodic circuit row configurations 100, the optimization component 208 can identify the mismatched logic gates. Further, the optimization component 208 can relocate the mismatched logic gates to compatible circuit rows while ensuring that each available region does not have overflows (e.g., the total logic gate width can be less than or equal to the width of the subject available region). Since different types of logic gates can be compatible with distinct types of circuit rows, each type of logic gate can be analyzed separately by the optimization component 208.

After identifying the mismatched gates, the optimization component 208 can perform a multi-stage (e.g., two-stage) machine learning algorithm to determine functional positions for the mismatched gates. For example, the optimization component 208 can perform a two-stage min-cost max-flow algorithm. At each stage, the optimization component 208 can build a flow network and/or apply the algorithm to assign mismatched logic gates to matched available regions. The optimization component 208 can map the flow to logic gate assignments by using each logic gate as one flow unit.

At a first stage, the optimization component 208 can use the average logic gate width to estimate an available region's capacity (e.g., how many logic gates can be inserted into the available region). The average logic gate width can provide a good estimation as to how many logic gates can be assigned to a subject available region. However, it is possible that during the flow mapping one or more logic gates (e.g., identified as mismatched logic gates) will not be able to fit into a compatible available region. The position of these unassigned logic gates can be determined during a second stage of analysis by the optimization component 208.

In the second stage, the one or more logic gates comprising the periodic circuit row configuration 100 can be grouped into one or more buckets based on their respective widths. Logic gates with the same and/or similar widths can be grouped, by the optimization component 208, into the same bucket and the one or more buckets can be processed one by one. For each bucket, the optimization component 208 can identify the logic gate with the greatest width and use the greatest width value to estimate an available region's capacity. Further, the optimization component 208 can apply the algorithm (e.g., a min-cost max-flow algorithm) again to facilitate mapping from the flow to the available region. Additionally, after the second stage, the optimization component 208 can perform one or more region placement techniques (e.g., single row and/or 1 dimension linear placement) resolve any overlapping placement of one or more logic gates.

The assignment component 212 can identify the one or more mismatched logic gates, generate a list of the identified mismatch logic gates, and/or perform the first stage of analysis of the one or more initial periodic circuit row configurations 100. In one or more embodiments, the assignment component 212 can utilize an iterative network flow based approach to assign mismatched logic gates to compatible available regions (e.g., wherein an available region can be determined as compatible based on one or more operational constraints of the one or more logic gates). For example, mismatched logic gates in the one or more initial periodic circuit row configurations 100 can be assigned alternate positions to facilitate functionality of the respective logic gates based on one or more operational constraints of the one or more logic gates. For instance, the one or more operational constraints can delineate compatibility between a subject logic gate and a type of circuit row. In one or more embodiments, the assignment component 212 can utilize an algorithm to facilitate a flow based available region assignment of the one or more mismatched logic gates based on an average width of the one or more mismatched logic gates.

For example, in one or more embodiments the assignment component 212 can utilize a min-cost max-flow algorithm to facilitate the first stage of analysis. For instance, the first stage can be characterized by the following steps. First, the assignment component 212 can calculate the average width value of the identified mismatched logic gates. Second, the assignment component 212 can generate a network graph (e.g., comprising a range regarding the circuit rows comprising the periodic circuit row configuration 100 and/or a range regarding the position of one or more logic gates within the one or more circuit rows). Third, the assignment component 212 can apply an algorithm such as a min-cost max-flow algorithm. Fourth, the assignment component 212 can derive an available region assignment for each of the mismatched logic gates based one or more respective operational constraints (e.g., compatibility) of the one or more logic gates. If a subject available region does not have overflow (e.g., has sufficient available space), then the one or more subject logic gate can be assigned to the subject available region. If a subject available region does not comprise sufficient space to house all the subject compatible mismatched logic gates, then the assignment component 212 can assign the subject mismatched logic gates to the subject available region based on the respective width values of the logic gates (e.g., from largest to smallest), wherein mismatched logic gates with the largest width value can be assigned to the subject available region prior to mismatched logic gates with smaller width values until there is no longer space to fit an additional mismatched logic gate in the subject available region. Next, the assignment component 212 can update the list of mismatched logic gates to account for those mismatched logic gates that have now been assigned to a compatible circuit row. If the updated list of mismatched logic gates is empty, then the first stage can be completed. Alternatively, if the updated list still comprises one or more mismatched logic gates, then the assignment component 212 can repeat the features of the first stage with regards to a different circuit row and/or different available regions. The processing features of the first stage can reiterate until all the mismatched logic gates are assigned a functional position in the subject periodic circuit row configuration 100 or all the circuit rows and/or available regions have been subjected to processing.

For instance, the assignment component 212 can generate an exemplary flow network $G=(V_f, E_f)$ in accordance with the following mathematical parameters.

(1) $V_f=\{s,t\} \cup V_g \cup V_{inr} \cup V_{outr}$, wherein "s" can represent a source node, and "t" can represent a sink node. Further, "$V_g$" can represent a mismatched logic gate node set and can equal $\{g_i|i=1 \ldots n\}$, wherein "n" can be an integer. "$V_{inr}$" can represent an in-node for one or more circuit row available regions, and can equal $\{r_i|i=1 \ldots m\}$, wherein "m" can be an integer. "$V_{outr}$" can represent an out-node for one or more circuit row available regions, and can equal $\{p_i|i=1 \ldots m\}$, wherein "m" can be an integer. Further, "g" can represent a respective logic gate, "r" can represent a respective circuit row, and/or "p" can represent empty space within a circuit row.

(2) $E_f=E_s \cup E_t \cup E_r \cup E_g$, wherein:
 $E_s=\{(s, g_i)|g_i \in V_g, i=1 \ldots n\}$;
 $E_t=\{(p_i, t)|p_i \in V_{outr}, i=1 \ldots m\}$;
 $E_r=\{(r_i, p_i)|r_i \in V_{inr}, p_i \in V_{outr}, i=1 \ldots m\}$;
 $E_g=\{(g_i, r_j)|g_i \in V_g, r_j \in V_{inr}, \text{ if } g_i \text{ can be assigned to available region } r_j.\}$ (3) Edge Capacity (e.g., wherein "U" can represent capacity):
 $e \in E_s, U_s(e)=1$;
 $e \in E_t, U_t(e)=\infty$;
 $e \in E_r, U_r(e)=(R_{width}-R_{used})$/average width of mismatched logic gates;
 $e \in E_g, U_g(e)=1$.

(4) Edge Cost (e.g., wherein "C" can represent cost):
 $e \in E_s, C_s(e)=0$;
 $e \in E_t, C_t(e)=0$;
 $e \in E_r, C_r(e)=0$;
 $e \in E_g, C_g(e)$=cost associated with the length of a wire operably connected to the subject logic gate.

Each mismatched logic gate can be represented by a node "$g_i$". Also, each available region can be represented by a capacitized node. The capacity of a subject available region can be the number of logic gates that can be inserted into the subject available region, and can be estimated as ($R_{width}-R_{used}$)/average width of mismatched logic gates. "$R_{width}$" can represent the total width of the available region, and "$R_{used}$" can represent the total width of logic gates already properly positioned in the available region based on one or more operational constraints (e.g., one or more compatibility constraints).

Figure 4A:
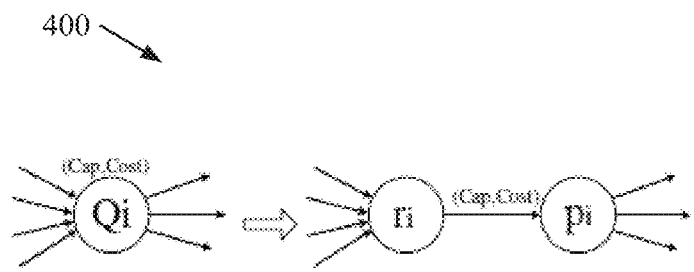
FIG. 4A illustrates a diagram of example, non-limiting node splitting that can be conducted by one or more systems to facilitate determining the functional placement of one or more logic gates in a self-aligned double patterning process in accordance with one or more embodiments described herein.

FIG. 4A illustrates a diagram of example, non-limiting node splitting 400 that can facilitate the optimization component 208 in performing the first stage and/or second stage of analysis in accordance with one or more embodiments described herein. Repetitive description of like elements employed in other embodiments described herein is omitted for sake of brevity.

For example, in one or more embodiments, the one or more flow networks generated by the assignment component 212 can lack support for capacitized nodes, and thus the assignment component 212 can use a pair of nodes (e.g., "$(r_i, p_i)$") to represent an available region. As shown in FIG. 4A, "$Q_i$" can represent an available region node with a capacity ("Cap") and a cost ("Cost"). "$Q_i$" can be represented by two nodes "$r_i$" and/or "$p_i$". An edge (e.g., represented by "$(r_i, p_i)$") can connect nodes "$r_i$" and/or "$p_i$". Further, the Cap and the Cost can be capacity and/or cost of "$(r_i, p_i)$", respectively.

All edge cost can be zero except at the edges from logic gates to available region in-nodes. Further, the edge cost of "$(g_j, r_i)$" can be the wirelength change of a wire operably coupled to a subject logic gate when the logic gate "$g_j$" is moved to a subject available region "$r_i$". At this point, the assignment component 212 can neglect considering the logic gate overlap constraint. The wirelength change can be based on the minimum logic gate location changes.

Figure 4B:
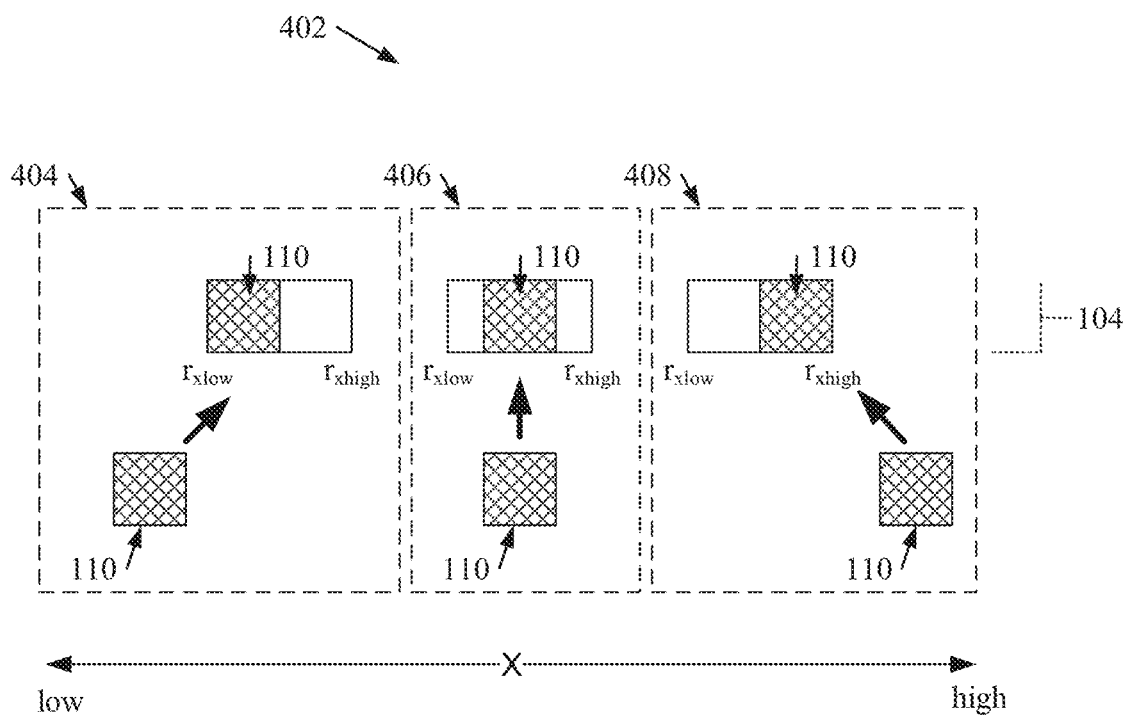
FIG. 4B illustrates a diagram of an example, non-limiting logic gate placement determination that can be performed by one or more systems to facilitate determining the functional placement of one or more logic gates in a self-aligned double patterning process in accordance with one or more embodiments described herein.

FIG. 4B illustrates a diagram of example, non-limiting position calculation 402 that can facilitate the optimization component 208 in performing the first stage and/or second stage of analysis in accordance with one or more embodiments described herein. Repetitive description of like elements employed in other embodiments described herein is omitted for sake of brevity.

As shown in FIG. 4B, the assignment component 212 can assume that the one or more circuit rows can extend along a horizontal direction (e.g., represented by the "X" arrow), wherein positions along the horizontal direction can be characterized by numerical values that can increase from a low value end to a high value end. Also, the assignment component 212 can use the respective center of the logic gates (e.g., represented by "$(g_x, g_{row})$") to represent the location of the subject logic gate "g". Additionally, the assignment component 212 can use "$(r_{xlow}, r_{xhigh}, r_{row})$" to denote the horizontal boundaries of an available region. As a mismatched logic gate is assigned to a compatible available region, the subject mismatched logic gate can be relocated from a first position to a second position (e.g., as delineated by the bold arrows presented in FIG. 4B).

In a first relocation occurrence 404, the subject mismatched logic gate (e.g., a second type of logic gate 110) can be relocated from an initial position that is outside the horizontal boundaries (e.g., boundaries along the horizontal direction represented by the "X" arrow) defining the assigned available region to which the logic gate will be moved into. For instance, in the first relocation occurrence 404, "$r_{xlow}$" can define the furthest left boundary of the subject available region along the horizontal direction (e.g., represented by the "X" arrow), and one or more portions of the subject logic gate can be positioned further left along the horizontal direction (e.g., represented by the "X" arrow) than the "$r_{xlow}$". Thus, to facilitate the relocation of the subject mismatched logic gate in the first relocation occurrence 404, the assignment component 212 can determine a new position along the horizontal direction (e.g., represented by the "X" arrow) to which the logic gate can be moved to facilitate occupation of the subject available region. For example, as shown in FIG. 4B, the subject logic gate can be relocated along the horizontal direction (e.g., in addition to relocation amongst different circuit rows) such that the far left horizontal boundary of the mismatched logic gate can be equal to the far left horizontal boundary of the available region. Thereby, the subject mismatched logic gate can be moved to a position along the horizontal direction that is within the horizontal boundaries defining the assigned compatible available region. Thus, if $g_x<r_{xlow}$, then the assignment component 212 can relocate the subject mismatched logic gate to a position along the horizontal direction such that $g_x=r_{xlow}$ (e.g., as depicted by the first relocation occurrence 404 in FIG. 4B).

In a second relocation occurrence 406, the subject mismatched logic gate (e.g., a second type of logic gate 110) can be relocated from an initial position that is within the horizontal boundaries (e.g., boundaries along the horizontal direction represented by the "X" arrow) defining the assigned available region to which the logic gate will be moved into. In which case, the assignment component 212 does not need to relocate the subject mismatched logic gate along the horizontal direction; rather, the assignment component 212 need only relocate the subject mismatched logic gate in a vertical direction to a new circuit row to facilitate occupation of the assigned compatible available region. Thus, if $r_{xlow} \leq g_x \leq r_{xhigh}$, then the assignment component 212 can leave the subject mismatched logic gate in its initial position along the horizontal direction (e.g., represented by the "X" arrow) such that $g_x=g_x$ (e.g., as depicted by the second relocation occurrence 406 in FIG. 4B).

In a third relocation occurrence 406, the subject mismatched logic gate (e.g., a second type of logic gate 110) can be relocated from an initial position that is outside the horizontal boundaries (e.g., boundaries along the horizontal direction represented by the "X" arrow) defining the assigned available region to which the logic gate will be moved into. For instance, in the third relocation occurrence 406, "$r_{xhigh}$" can define the furthest right boundary of the subject available region along the horizontal direction (e.g., represented by the "X" arrow), and one or more portions of the subject logic gate can be positioned further right along the horizontal direction (e.g., represented by the "X" arrow) than the "$r_{xhigh}$". Thus, to facilitate the relocation of the subject mismatched logic gate in the third relocation occurrence 406, the assignment component 212 can determine a new position along the horizontal direction (e.g., represented by the "X" arrow) to which the logic gate can be moved to facilitate occupation of the subject available region. For example, as shown in FIG. 4B, the subject logic gate can be relocated along the horizontal direction (e.g., in addition to relocation amongst different circuit rows) such that the far right horizontal boundary of the mismatched logic gate can be equal to the far right horizontal boundary of the available region. Thereby, the subject mismatched logic gate can be moved to a position along the horizontal direction that is within the horizontal boundaries defining the assigned compatible available region. Thus, if $g_x>r_{xlow}$, then the assignment component 212 can relocate the subject mismatched logic gate to a position along the horizontal direction such that $g_x=r_{xhigh}-g_{width}$ (e.g., as depicted by the first relocation occurrence 404 in FIG. 4B), wherein "$g_{width}$" can be the width of the subject mismatched logic gate.

One of ordinary skill in the art will recognize that although the position calculation 402 is depicted with regards to one or more second type of logic gates 110 and/or one or more second type of circuit rows 104, the architecture of the position calculation 402 is not so limited. For example, the features depicted and/or described with regards to FIG. 4B can also be applied by the assignment component 212 to one or more other types of logic gates (e.g., one or more first type of logic gates 108) and/or one or more other types of circuit rows (e.g., one or more second type of circuit rows 102).

FIG. 5A illustrates a diagram of an example, non-limiting flow network 500 that can be generated by the optimization component 208 (e.g., the assignment component 212) and can facilitate performing the first stage and/or second stage of analysis in accordance with one or more embodiments described herein. Repetitive description of like elements employed in other embodiments described herein is omitted for sake of brevity.

Exemplary flow network 500 can regard three mismatched logic gates (e.g., respectively represented by "$g_1$", "$g_2$" and/or "$g_3$") and/or four available regions (e.g., represented by "$r_1$", "$r_2$", "$r_3$" and/or "$r_4$"). Each available region can be represented by a pair of nodes (e.g., represented by ($r_i$, $p_i$), wherein i=1, 2, 3, or 4 respectively). As shown in FIG. 5, a first mismatched logic gate "$g_1$" can be assigned, in accordance with operational constraints, to "region 1" and/or "region 2". A second mismatched logic gate "$g_2$" can be assigned, in accordance with operational constraints, to "region 1", "region 2", and/or "region 3". Further, the third mismatched logic gate "$g_3$" can be assigned, in accordance with operational constraints, to "region 3" and/or "region 4". The edge cost from "$g_i$" (e.g., "$g_1$") to "$r_j$" (e.g., "$r_1$") can be the wirelength change if the subject mismatched logic gate "$g_i$" is moved to the subject available region "$r_j$".

Once a flow network graph (e.g., exemplary flow network 500) is generated, the assignment component 212 can utilize one or more algorithms to optimize functional placement of the one or more mismatched logic gates. For example, the assignment component 212 can apply a min-cost max-flow algorithm. The assignment component 212 can assign mismatched logic gates with the largest width values first, as mismatched logic gates with smaller width values can be relatively easier to relocate.

FIG. 5B illustrates a diagram of an example, non-limiting assignment algorithm 502 that can be generated by the optimization component 208 (e.g., the assignment component 212) and can facilitate performing the first stage and/or second stage of analysis in accordance with one or more embodiments described herein. Repetitive description of like elements employed in other embodiments described herein is omitted for sake of brevity. For example, the assignment component 212 can apply the exemplary assignment algorithm 502 once one or more flow network graphs (e.g., exemplary flow network graph 500) are generated.

After assigning some logic gates to available regions, the assignment component 212 can update the list of mismatched logic gates. Subsequently, the next iteration of assignments can be based on the updated list of mismatched logic states. Further, with each iteration of logic gate assignment, the assignment component 212 can increase a search space for applicable available regions for the remaining mismatched logic gates (e.g., by increasing the range of circuit rows analyzed by the assignment component 212 and/or increasing the range of positions along the horizontal direction that are analyzed by the assignment component 212). The loop of assignment iterations performed by the assignment component 212 can cease based on, for example: the updated list of mismatched logic gates being empty (e.g., functional placement locations have been determined for all the mismatched logic gates); or the number of iterations has reached a threshold defined by one or more parameters of the subject periodic row circuit configuration 100 (e.g., there are no additional circuit rows and/or available space to analyze).

While one or more min-cost max-flow algorithms are described herein to exemplify one or more features of the assignment component 212, one of ordinary skill in the art will recognize that other polynomial based algorithms (e.g., machine learning algorithms) can be implemented by the optimization component 208 (e.g., the assignment component 212) to perform the described features. For example, other polynomial based algorithms that can be implemented by the assignment component 212 to facilitate determining functional placement of one or more mismatched logic gates can include, but are not limited to: a double scaling algorithm, and/or the like (e.g., any algorithm that can solve a min-cost max-flow problem).

When the average mismatched logic gate width is used in the first stage to estimate the capacity of one or more available regions, it is possible that the one or more flow networks generated by the assignment component 212 can find all the flows, but one or more mismatched logic gates can remain unassigned. In other words, the assignment component 212 can locate compatible available regions for one or more mismatched logic gates, but fail to located compatible available regions with sufficient space to facilitate the functional placement of one or more mismatched logic gates. Wherein this problem arises (e.g., remaining unassigned mismatched gates after the features of the first stage are performed by the assignment component 212), the swap component 214 can perform a second stage of analysis using maximum logic gate widths.

For example, the swap component 214 can partition assigned logic gates (e.g., non-mismatched logic gates) comprising a subject periodic circuit row configuration 100 into one or more gate groups. The one or more gate groups can neighbor a subject mismatched logic gate. Further the summation of the width values of the logic gates comprising a subject gate group can be the maximum logic gate width of the subject gate group, and the maximum logic gate width of the subject gate group can be the same and/or similar (e.g., equivalent) to the width value of the subject mismatched logic gate. Thus, the swap component 214 can generate one or more gate groups that can be exchanged with a subject mismatched logic gate to facilitate functional placement of the mismatched logic gate, wherein subsequent to the exchange the logic gates comprising the gate group can be reassigned to other functional placements.

The swap component 214 can apply one or more polygonal algorithms based on the maximum logic gate widths. For instance, the swap component 214 can apply a min-cost max-flow algorithm based on the assignment algorithm 502 using the maximum logic gate width of one or more gate groups to estimate the capacity of an available region. Since mismatched logic gates within a group can have similar width values, utilizing the maximum logic gate width can accurately reflect the capacity of an available region while assuring one-to-one mapping from the flow to logic gate assignment. Moreover, in one or more embodiments the swap component 214 can introduce swapping groups into the one or more flow network graphs generated by the optimization component 208 to place mismatched logic gates in positions near their original placement positions.

For a mismatched logic gate, the swap component 214 can search the logic gate's neighboring available regions. If one or more mismatched logic gates with similar width values are positioned in an available region near the subject mismatched logic gate, then the swap component can exchange the subject mismatched logic gate with the one or more neighboring mismatched logic gates, which can thereby facilitate the functional placement of two or more mismatched logic gates (e.g., the mismatched logic gates subject to the exchange). Wherein the initial periodic circuit row configuration 100 does not have neighboring mismatched logic gates with similar width values to facilitate an exchange with a subject mismatched logic gate, the swap component 214 can consider one or more gate groups having a maximum logic gate width (e.g., a total width value of the logic gates comprising the gate group) that is equal to or less than the width of the subject mismatched logic gate for exchange with the subject mismatched logic gate.

For example, wherein there are K logic gates in an available region "r", the total number of non-empty gate groups can be $2^K-1$. However, it may not be necessary to explore all logic gate combinations. In other words, it can be undesirable for a mismatched logic group to be exchanged with a large number of other logic gates. Therefore, the swap component 214 can limit the number of logic gates comprised within one or more gate groups. For instance, the swap component 214 can limit the number of logic gates comprised within a gate group to an integer greater than or equal to 2 (e.g., the number of logic gates per gate group can be limited to 2 to 3 logic gates). Then the subject gate group can be bound by the swap component 214 by $O(K^2)$ or $O(K^3)$.

FIG. 6A illustrates a diagram of an example, non-limiting group selection algorithm 600 that can facilitate selecting one or more gate groups that can be exchanged with a subject mismatched logic gate to facilitate functional placement of the mismatched logic gate in accordance with one or more embodiments described herein. Repetitive description of like elements employed in other embodiments described herein is omitted for sake of brevity. The group selection algorithm 600 can represent an example algorithm that can be implemented by the swap component 214 to identify and/or select one or more gate groups that can be exchanged with a subject mismatched gate.

As shown in FIG. 6A, the number of logic gates within a gate group can be controlled by the parameter "gnum". Further, "gwt" can represent a logic gate width threshold, "$g_{width}$" can represent the maximum logic gate width (e.g., summation of the width values of the logic gates comprising a subject gate group), and/or "$r_{empty}$" can represent the empty space of a subject available region "r". Since a gate group can be used to exchange positions with a subject mismatched logic gate, the maximum logic gate width (e.g., total width value) of the gate group has to the equal to or less than the width of the subject mismatched logic gate. If the maximum logic gate width ("$g_{width}$") is larger than the width of the subject mismatched logic gate (e.g., the logic gate threshold "gwt"), the gate group can be dropped from consideration for the exchange by the swap component 214. Alternatively, if the maximum logic gate width of the subject gate group (e.g., the total width value of the logic gates comprising the gate group) is smaller than the width value of the subject logic gate, empty space within the available region can be considered (e.g., added to the maximum logic gate width) to achieve an equivalent width value that can facilitate exchange of the gate group and the subject mismatched logic gate.

After creating all the potential gate groups and analyzing the gate groups with respect to a subject mismatched logic gate, the swap component 214 can sort the gate groups based on their movement cost. For a given available region, the movement cost of a gate group can be the total wirelength change (e.g., change in the total length of wire operably coupled to the logic gates within the gate group) when all the logic gates in the subject gate group are exchanged with the subject mismatched logic gate. For a mismatched logic gate, the swap component 214 can determine a searching space to facilitate the position exchange based on the circuit row (e.g., "row_range") and horizontal position (e.g., "x_range") (e.g., position along the direction represented by the "X" arrow) of the mismatched logic in its initial placement. Once the search space is determined, the swap component 214 can use the average group movement cost (e.g., "ave_group- _movement_cost") to estimate the subject group gates movement cost, wherein the average group movement cost can be the average movement cost of the subject gate group with respect to all available regions within the search space.

In additional to the group gate width requirement, the swap component 214 can also ensure that logic gates are not shared by multiple selected gate groups. If a logic gate belongs to multiple gate groups, the logic gate can possibly be assigned to multiple positions (e.g., to facilitate multiple exchanges), which is not feasible for functional placement. Therefore, the swap component 214 can create and/or maintain a list of selected logic gates (e.g., "SelectedGates") and/or a list of selected gate groups (e.g., "SelectedGroups") to record logic gates that have been selected by the swap component 214 to facilitate a position exchange (e.g., to relocate one or more mismatched logic gates to a functional placement). When none of the logic gates comprising a gate group are included in the list of selected logic gates, the swap component 214 can select the subject gate group for a position exchange and thereby the logic gates comprising the gate group can be added to the list of selected logic gates and/or the list of selected gate groups.

Additionally, in one or more embodiments one or more of the gate groups can further comprise empty space within one or more available regions. Wherein a gate group comprises empty space, the total empty space in the gate group can be less than or equal to the amount of empty space in the subject available region. Further, the swap component 214 can create and/or maintain a list of used empty space (e.g., "UsedEmptySpace"), wherein used empty space can be empty space comprised within a selected gate group. Moreover, after adding one or more gate groups to the list of selected groups, the swap component 214 can update the list of selected logic gates and/or the list of used empty space.

For instance, the following example circumstances can illustrate how the swap component 214 can identify one or more gate groups to exchange position with a mismatched logic gate. For example, wherein there are five logic gates in a subject available region, the swap component 214 can represent the logic gates as "$g_1^{10}$", "$g_2^8$", "$g_3^5$", "$g_4^5$" and/or "$g_5^2$"; wherein the subscript can be the logic gate number and the superscript can be the width value of the subject logic gate. Further, for the subject available region there can be empty space with a width value of 5, and the swap component 214 can limit the number of logic gates per gate group (e.g., "gnum") to 2. Also, the width value of the subject mismatched logic gate (e.g., "gwt") can be 8. If the total width of the logic gates comprised within a gate group is less than 8 (e.g., the width value of the mismatched logic gate) that the swap component 214 can add empty space to the gate group to reach a maximum logic gate width of 8. For example, "$p^i$" can represent an empty space "p" with a width value "i". Given the logic gate number limitation, the total number of gate groups that can be formed by the swap component 214 can be 15 gate groups.

Wherein the composition of the gate groups can be defined by "{ ... }", the 15 gate groups can be characterized by the following: $\{g_1^{10}\}$, $\{g_2^8\}$, $\{g_3^5, p^3\}$, $\{g_4^5, p^3\}$, $\{g_5^2, p^6\}$, $\{g_1^{10}, g_2^8\}$, $\{g_1^{10}, g_3^5\}$, $\{g_1^{10}, g_4^5\}$, $\{g_1^{10}, g_5^2\}$, $\{g_2^8, g_3^5\}$, $\{g_2^8, g_4^5\}$, $\{g_2^8, g_5^2\}$, $\{g_3^5, g_4^5\}$, $\{g_3^5, g_5^2, p^1\}$, and/or $\{g_4^5, g_5^2, p^1\}$. But with the width constraint of 8 (e.g., the width value of the subject mismatched logic gate), the swap component 214 can narrow the eligible gate groups to 6 gate groups. The composition of the 6 gate groups that can meet the width constraint can be characterized by the following: $\{g_2^8\}$, $\{g_3^5, p^3\}$, $\{g_4^5, p^3\}$, $\{g_5^2, p^6\}$, $\{g_3^5, g_5^2, p^1\}$, and/or $\{g_4^5, g_5^2, p^1\}$. The swap component 214 can further remove gate group $\{g_5^2, p^6\}$ from the list of eligible gate groups, since the amount of available empty space is limited in this instance to 5.

Further, the swap component 214 can sort the eligible gate groups based on their average group movement cost. For example, the sorted list of eligible gate groups can be: $\{g_2^8\}$, $\{g_3^5, p^3\}$, $\{g_4^5, p^3\}$, $\{g_3^5, g_5^2, p^1\}$, and/or $\{g_4^5, g_5^2, p^1\}$. From the sorted list, the swap component 214 can first identify gate groups $\{g_2^8\}$, $\{g_3^5, p^3\}$ for selection. Following, the amount of available empty space is diminished to a value of 2; thus, the swap component 214 can not further identify gate group $\{g_4^5, p^3\}$ for selection. Additionally, the swap component 214 can not further identify gate group $\{g_3^5, g_5^2, p^1\}$ since the logic gate "$g_3^5$" is comprised within an already identified gate group (e.g., $\{g_3^5, p^3\}$). Lastly, the swap component 214 can identify the gate group $\{g_4^5, g_5^2, p^1\}$ for selection. Thus, the swap component 214 can identify the gate groups $\{g_2^8\}$, $\{g_3^5, p^3\}$, $\{g_4^5, g_5^2, p^1\}$, from the total number of possible gate groups, as gates that can be selected to facilitate a position exchange with the subject mismatched logic gate.

Once the swap component 214 identifies one or more gate groups to facilitate a position exchange, the reassignment component 216 can reassign (e.g., using a flow network graph) the position of the one or more logic gates comprising the gate group to the position of the subject mismatched logic gate and vise versa.

FIG. 6B illustrates an example, non-limiting reassignment algorithm 604 that can be implemented by the reassignment component 216 to facilitate exchanging the position of one or more identified gate groups with one or more subject mismatched logic gates. Repetitive description of like elements employed in other embodiments described herein is omitted for sake of brevity. The reassignment algorithm 602 can represent an example algorithm that can be implemented by the reassignment component 216.

Figure 7:
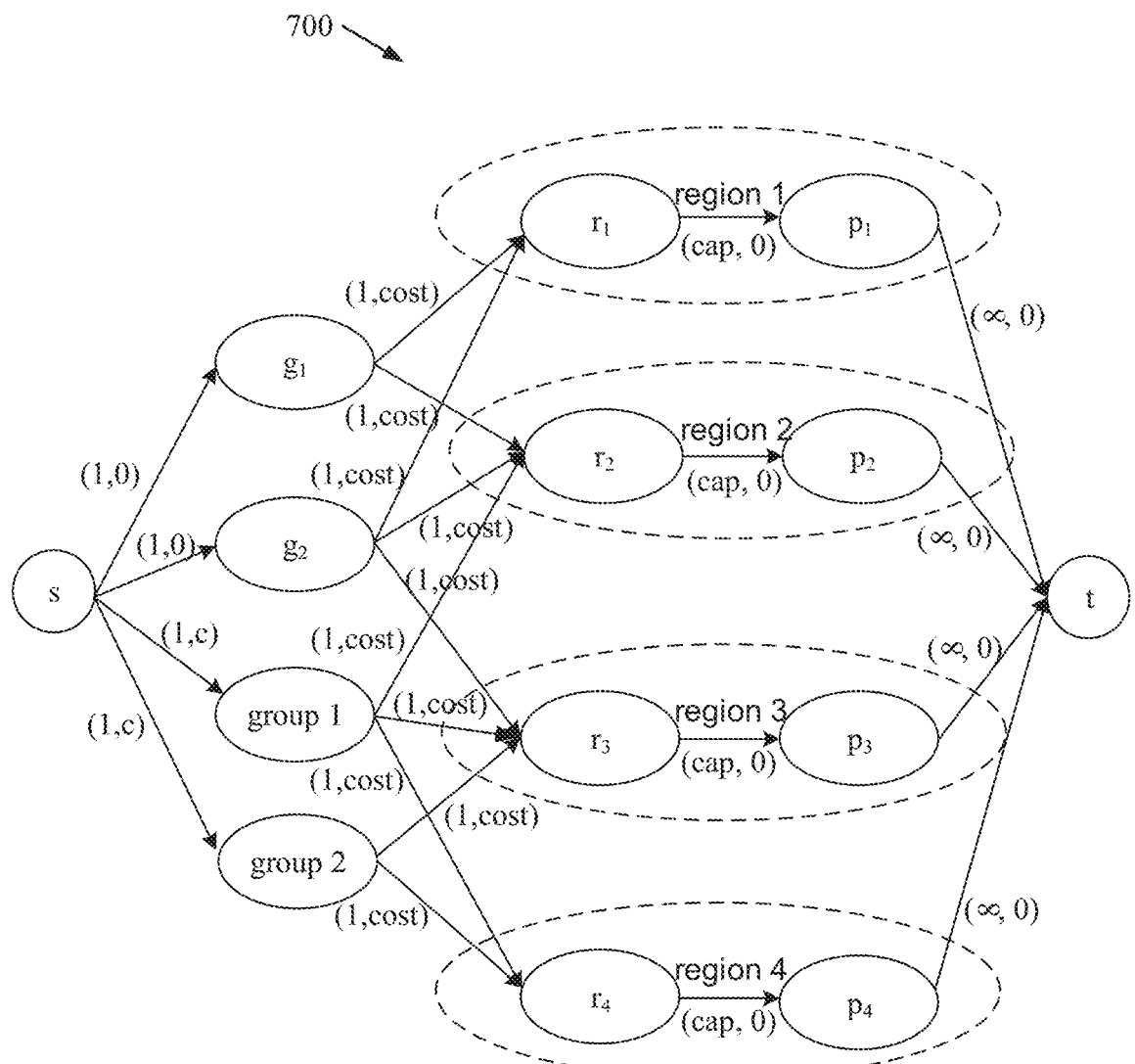
FIG. 7 illustrates a diagram of an example, non-limiting flow network graph that can be generated by one or more systems to facilitate determining the functional placement of one or more logic gates in a self-aligned double patterning process in accordance with one or more embodiments described herein.

Further, FIG. 7 illustrates an example, non-limiting flow network graph 700 that can facilitate exchanging the position of one or more identified gate groups with one or more subject mismatched logic gates. Repetitive description of like elements employed in other embodiments described herein is omitted for sake of brevity. In one or more embodiments, the reassignment component 216 can implement a flow network graph similar to the exemplary flow network graph 700 to facilitate logic gate position reassignments in a second stage of analysis by the optimization component 208 (e.g., which can be further facilitated by the reassignment algorithm 604). Thus, the reassignment component 216 can perform a second logic gate assignment in the second stage of analysis performed by the optimization component 208.

In the exemplary flow network graph 700, each gate group can be represented by a node. If an available region is within the allowable assignment area of a subject gate group (e.g., in accordance with one or more operational constraints), the reassignment component 216 can create an edge to connect the subject gate group node and the subject available region node. For instance, in the exemplary flow network graph 700 there can be two mismatched logic gates represented by "$g_1$" and "$g_2$" respectively. With respect to the two mismatched logic gates, the swap component 214 can identify two gate groups (e.g., represented by "group 1" and "group 2" respectively) in the search area of the mismatched logic gates. In exemplary flow network graph 700, the first gate group (e.g., "group 1") can be assigned to the second available region (e.g., "region 2"), the third available region (e.g., "region 3"), and/or the fourth available region (e.g., "region 4") in accordance with one or more operational constraints of the logic gates comprising the first gate group. Also, the second gate group (e.g., "group 2") can be assigned to the third available region (e.g., "region 3") and/or the fourth available region (e.g., "region 4") in accordance with one or more operational constraints of the logic gates comprising the second gate group. Additionally, the reassignment component 216 can add further edges to connect gate group nodes to the available region nodes.

To give the mismatched logic gates a higher priority, the reassignment component 216 can assign a relatively large cost to the edges from the source node to the gate group nodes. Since the edge cost from the source node to the mismatched logic gate nodes is zero, the mismatched logic gates can have a better chance to be assigned to a new position first. Further, the capacity of an available region can be calculated by the reassignment component 216 using the maximum logic gate width of the subject gate groups. The reassignment component 216 can map (e.g., via a flow network graph such as the exemplary flow network graph 700) from the flow to a logic gate available region assignment. In other words, the reassignment component 216 can relocate one or more logic gates into an available region wherein there is a flow from a mismatched logic gate to an available region.

After a first iteration of logic gate assignment (e.g., in accordance with line 3.2 of the reassignment algorithm 604), it is possible that one or more mismatched logic gates and/or one or more gate groups are not relocated (e.g., assigned) by the reassignment component 216. Regarding unassigned mismatched logic gates, the reassignment component 216 can facilitate relocation of the remaining mismatched logic gates in future iterations of the one or more algorithms utilized by the reassignment component 216 (e.g., reassignment algorithm 604) based on a larger search reach area than that used in the first iteration. With regards to unassigned gate groups, it is not necessary to allocate all logic gates of a gate group to the same available region. Instead, the logic gates comprising the remaining gate groups can be re-grouped (e.g., by the reassignment component 216 and/or the swap component 214) into gate groups based on respective width values; thereby providing more opportunities for logic gates to form gate groups that can be assigned in future iterations of the algorithm (e.g., the reassignment algorithm 604).

FIGS. 8A-8E can illustrate diagrams of example, non-limiting stages of gate group identification and/or position exchange that can be implemented by the swap component 214 and/or the reassignment component 216 to facilitate functional placement of one or more logic gates in a periodic circuit row configuration 100 in accordance with one or more embodiments described herein. Repetitive description of like elements employed in other embodiments described herein is omitted for sake of brevity. FIGS. 8A-8E can exemplify one or more features of the swap component 214 and/or the reassignment component 216.

Figure 8A:
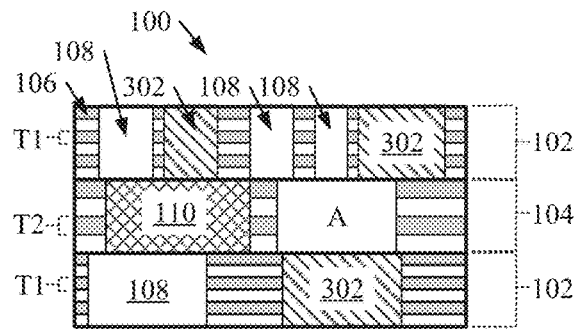
FIG. 8A illustrates a diagram of an example, non-limiting periodic circuit row configuration comprising one or more logic gates that can be moved by a system to facilitate one or more operational constraints in accordance with one or more embodiments described herein.

FIG. 8A can depict a periodic circuit row configuration 100 initially designed by one or more SADP processes and/or subsequent to a first stage of analysis by the optimization component 208 (e.g., via the assignment component 212). As shown in FIG. 8A, the periodic circuit row configuration 100 can comprise one or more mismatched logic gates. For example, in FIG. 8A, the periodic circuit row configuration 100 can comprise a first type of logic gate 108 (e.g., represented by "A") positioned in on a second type of circuit row 104. Wherein one or more operational constraints of the first type of logic gate 108 can delineate placement on a first type of circuit row 102 for functionality, logic gate "A" can be considered (e.g., by the optimization component 208) a mismatched logic gate due to its non-functional placement on a second type of circuit row 104.

Figure 8B:
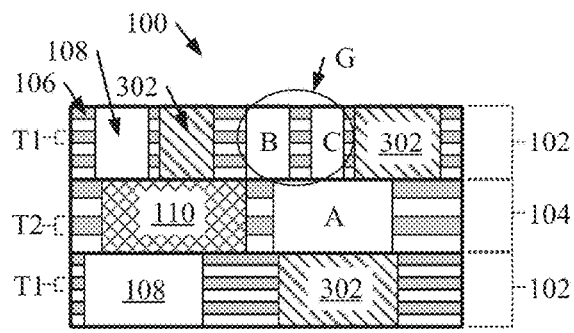
FIG. 8B illustrates a diagram of an example, non-limiting periodic circuit row configuration comprising one or more logic gates that can be moved by a system to facilitate one or more operational constraints in accordance with one or more embodiments described herein.

In FIG. 8B, the optimization component 208 (e.g., via the swap component 214) can identify a gate group (e.g., represented by the "G" circle) that can facilitate a position exchange to relocate the mismatched logic gate "A" to a functional position. As shown in FIG. 8B, the identified gate group "G" can comprise one or more logic gates (e.g., a first logic gate "B" and/or a second logic gate "C") and/or empty space within the subject available region of the subject circuit row (e.g., first type circuit row 102). Further, the maximum logic gate width value of the identified gate group "G" can be equal to the width value of the subject mismatched logic gate "A".

Figure 8C:
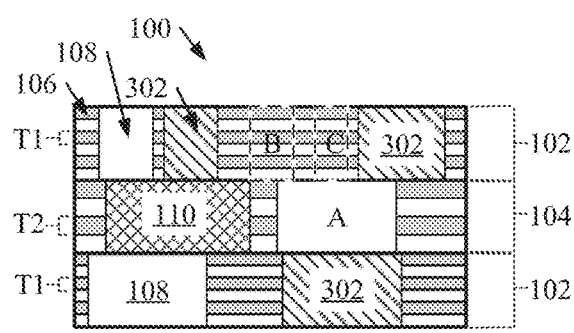
FIG. 8C illustrates a diagram of an example, non-limiting periodic circuit row configuration comprising one or more logic gates that can be moved by a system to facilitate one or more operational constraints in accordance with one or more embodiments described herein.

As shown in FIG. 8C, the optimization component 208 (e.g., via the swap component 214 and/or the reassignment component 216) can select the identified gate group "G" for relocation. For example, the assignment component 212 can remove the logic gates comprised within the identified gate group "G" from their respective positions to make room for a position exchange with the subject mismatched logic gate "A". As shown in FIG. 8C, the dashed lines can indicate the positions from which the respective logic gates (e.g., logic gate "B" and/or logic gate "C") can be removed.

Figure 8D:
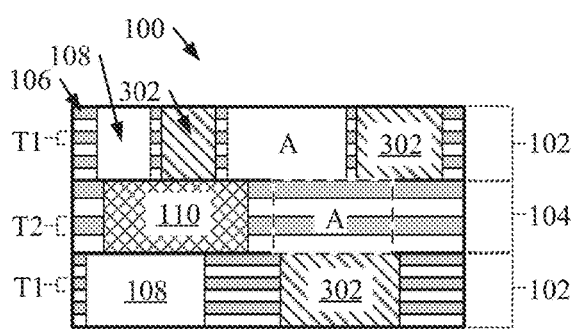
FIG. 8D illustrates a diagram of an example, non-limiting periodic circuit row configuration comprising one or more logic gates that can be moved by a system to facilitate one or more operational constraints in accordance with one or more embodiments described herein.
Figure 8E:
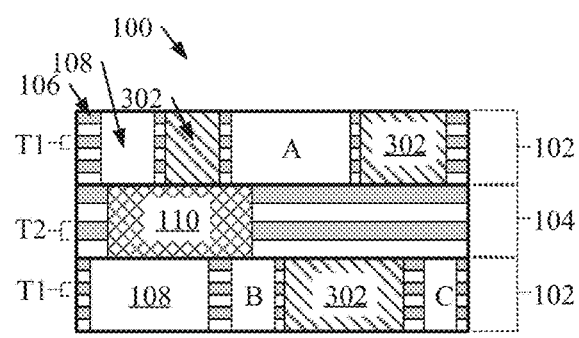
FIG. 8E illustrates a diagram of an example, non-limiting period circuit row configuration comprising one or more logic gates autonomously placed in functional positions by one or more systems in accordance with one or more embodiments described herein.

As shown in FIG. 8D, the optimization component 208 (e.g., via the reassignment component 216) can further relocate the mismatched logic gate "A" to the space formally occupied by the selected gate group "G". In other words, the reassignment component 216 can exchange a position of the identified gate group "G" (e.g., comprising logic gate "B" and/or logic gate "C") with the mismatched logic gate "A". As a result of the relocation, logic gate "A" can be functionally positioned on a first type of circuit row 102. As shown in FIG. 8D, dashed lines can indicate the position from which the mismatched logic gate "A" can be removed.

As shown in FIG. 9E, the optimization component 208 (e.g., via the reassignment component 216) can further relocate the logic gates comprising the identified and/or selected gate group "G". For example, logic gate "B" and/or logic gate "C" can be relocated to one or more positions within the periodic circuit row configuration 100 based on available space and/or respective operational constraints of the respective logic gates. As shown in FIG. 9E, the logic gates comprised within the gate group "G" can be first type of logic gates 108 and can have operational constraints requiring functional placement on a first type of circuit row 102. Thus, logic gate "B" and/or logic gate "C" can be relocated to positions on one or more available regions located on one or more first type of circuit rows 102, wherein the available regions can comprise enough empty space to facilitate positioning of the logic gates.

One of ordinary skill in the art will recognize that the position exchange depicted in FIGS. 8A-8E is exemplary, and the architecture of the optimization component 208 is not so limited. For example, the optimization component 208 can facilitate position exchanges of one or more mismatched logic gates with one or more gate groups wherever: the subject one or more gate groups meet the width requirements of the one or more mismatched gates; and/or the subject one or more gate groups are located in one or more positions that meet the one or more operational constraints of the one or more mismatched logic gates. For instance, the optimization component 208 can swap a mismatched logic gate with another logic gate of the same type or of a different type. In another instance, the optimization component 208 can swap a mismatched logic gate with a gate group comprising a plurality of logic gates, wherein one or more of the logic gates comprising a subject gate group can be of the same type as the mismatched logic gate or of a different type.

FIG. 9 illustrates a diagram of an example, non-limiting table 900 that can depict design information for one or more periodic row configurations 100 that can be analyzed using the system 200 to demonstrate the efficacy of the various features described in accordance with one or more embodiments described herein. Repetitive description of like elements employed in other embodiments described herein is omitted for sake of brevity.

To demonstrate the efficacy of the system 200, the algorithms described herein were implemented in C++ and integrated into a physical-synthesis system. All test cases were derived from industrial designs and were tested on a Linux workstation (e.g., 2.66 GHz). The second type of circuit rows 104 can be periodically assigned with a ratio of second type of circuit row 104 to first type of circuit row 102 of 1:4.

The various features of the system 200 described with regards to one or more embodiments herein was compare against a second analysis approach. For the second analysis approach, all mismatched logic gates can be first sorted based on their respective logic gate widths. Then the respective mismatched logic gates can be processed individually starting with the logic gate having the largest width value. Once a mismatched logic gate is processed, the traditional analysis approach can search in a region surrounding the subject logic gate, wherein the region can be a rectangular region. The original logic gate location can be the center of the search region and the rectangle size can be bound the circuit row and/or position thresholds. For each feasible location in the search region, the second analysis approach can calculate the logic gate movement cost using the same cost function as the one utilized in a SADP-placer, wherein the mismatched logic gate can be placed in the minimum cost location.

FIG. 10 illustrates a diagram of an example, non-limiting table 1000 that can depict the total wire length ("TWL") comparison results of the analysis using the system 200 and/or the second analysis approach in accordance with one or more embodiments described herein. Repetitive description of like elements employed in other embodiments described herein is omitted for sake of brevity. The TWL can be the wire length after available region assignment and/or placement. As shown in table 1000, for all the designs described in table 900, the wire length degradation experienced by the system 200 can be significantly less than wire length degradation experienced by the second analysis approach. On average, the total wire length increase experienced by functional placement performed by the system 200 can be 2.8%, as compared to a total wire length increase of 29.4% experienced by the second analysis approach.

FIG. 11 illustrates a diagram of example, non-limiting table 1100 and table 1102 that can further depict the efficacy of the system 200 in accordance with one or more embodiments described herein. Repetitive description of like elements employed in other embodiments described herein is omitted for sake of brevity. Table 1100 and/or table 1102 can depict comparison results of the second analysis approach and the system 200 analysis features with regards to the designs described in table 900 based on location changes. As shown in FIG. 11, "1ST" can represent the second analysis approach, and "2ND" can represent a placement analysis performed by the system 200. Further, "LocChange" can represent the total distance change between the original logic gate locations and the final logic gate locations. With regards to both the average total distance change "AverageLocChange" and the maximum total distance change "MaxLocChange" the system 200 described herein can be achieve more can achieve a more efficient result than the second analysis approach.

Figure 12:
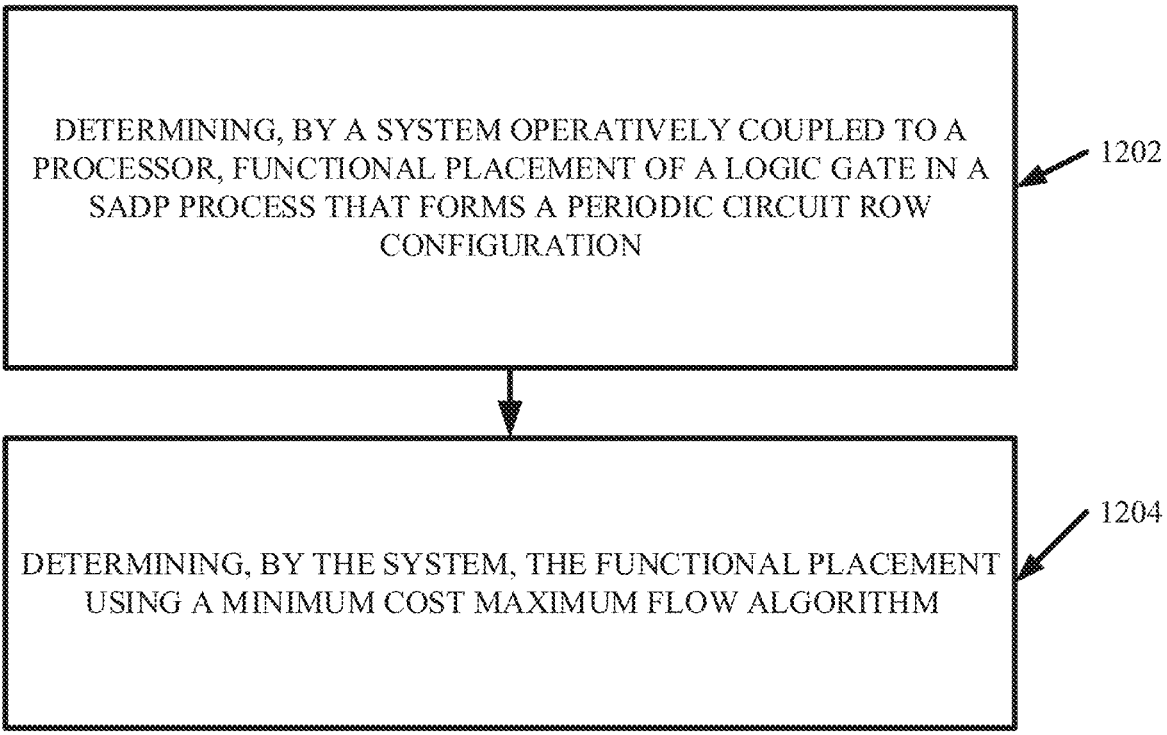
FIG. 12 illustrates a flow diagram of an example, non-limiting method that can facilitate determining the functional placement of one or more logic gates in a self-aligned double patterning process that can form a periodic circuit row configuration in accordance with one or more embodiments described herein.

FIG. 12 illustrates a flow diagram of an example, non-limiting method 1200 that can facilitate determining the functional placement of one or more logic gates in a period circuit row configuration 100 in accordance with one or more embodiments described herein. Repetitive description of like elements employed in other embodiments described herein is omitted for sake of brevity. At 1202, the method 1200 can comprise determining, by a system 200 (e.g., via optimization component 208) operatively coupled to a processor 222, functional placement of one or more logic gates in one or more SADP processes that can form one or more periodic circuit row configurations 100. The one or more periodic circuit row configurations 100 can comprise a first circuit row (e.g., first type of circuit row 102) and/or a second circuit row (e.g., second type of circuit row 104). Additionally, a first thickness (e.g., "T1") of a first wire track 106 comprised within the first circuit row (e.g., first type of circuit row 102) can be different (e.g., thinner) than a second thickness (e.g., "T2") of a second wire track 106 comprised within the second circuit row (e.g., second type of circuit row 104).

Additionally, the one or more logic gates can be one or more first type of logic gates 108 and/or one or more second type of logic gates 110. Also, the one or more logic gates can have respective operational constraints that can define one or more parameters for functionality of the respective logic gates. For example, in one or more embodiments the functional placement of the one or more logic gates at 1202 (e.g., functional placement of a first type of logic gate 108 on a first type of circuit row 102) can be based on an operational constraint delineating a wire track 106 thickness that facilitates functionality of the respective logic gates. In another example, the functional placement can further be based on an operational constraint that delineates an amount of space needed on a subject circuit row to facilitate functionality of the respective logic gates.

In various embodiments, the determining at 1202 can comprise determining, by the system 200, whether one or more logic gates are positioned on a functional circuit row of the periodic circuit row configuration 100 based on one or more operational constraints of the one or more logic gates. For example, the system 200 (e.g., via the optimization component 208) can identify one or more mismatched logic gates comprised within the periodic circuit row configuration 100. Additionally, wherein the system 200 identifies a mismatched logic gate, the system 200 (e.g., via the optimization component 208) can replace the mismatched logic gate with a second logic gate that is positioned on a circuit row that meets the operational constraints of the logic gate and thereby can facilitate functionality. To facilitate a replacement of the second logic gate with the mismatched logic gate, the second logic gate can have a width value less than or equal to a width value of the mismatched logic gate. Moreover, in one or more embodiments the system 200 (e.g., via the optimization component 208) can exchange the position of a mismatched logic gate with one or more gate groups (e.g., created by the swap component 214).

Furthermore, at 1204, the method 1200 can comprise, determining, by the system 200 (e.g., optimization component 208), the functional placement using one or more min-cost max flow algorithms. For example, the system 200

(e.g., via the optimization component 208) can utilized the assignment algorithm 502, the group selection algorithm 600, and/or the reassignment algorithm 602 along with one or more flow network graphs (e.g., exemplary flow network graph 500 and/or exemplary flow network graph 700) to facilitate determining the functional placement of one or more logic gates (e.g., one or more mismatched logic gates).

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 13:
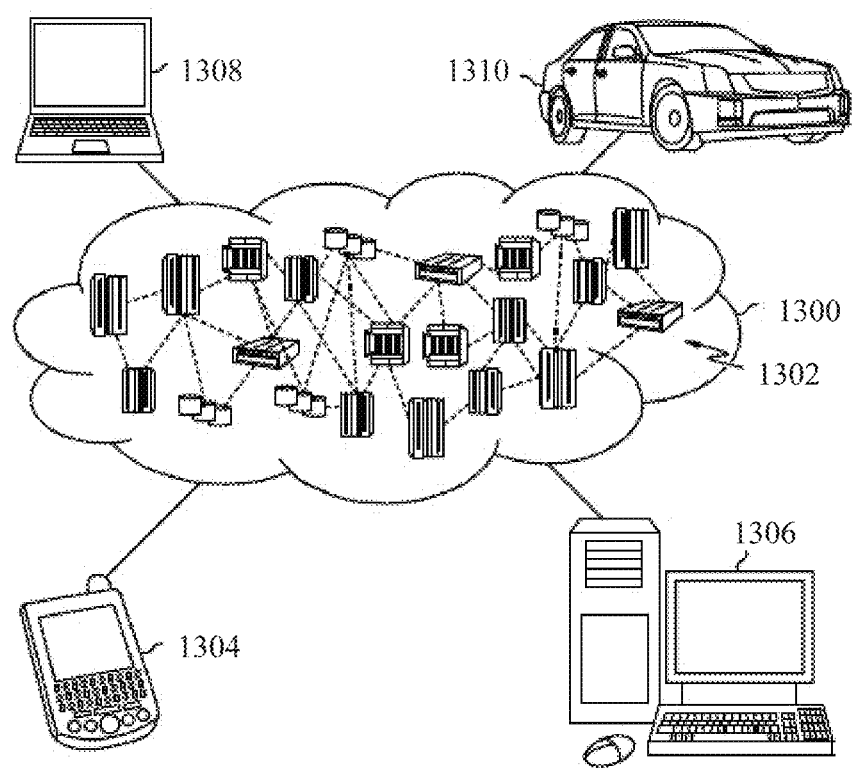
FIG. 13 depicts a cloud computing environment in accordance with one or more embodiments described herein.

Referring now to FIG. 13, illustrative cloud computing environment 1300 is depicted. As shown, cloud computing environment 1300 includes one or more cloud computing nodes 1302 with which local computing devices used by cloud consumers, such as, for example, personal digital assistant (PDA) or cellular telephone 1304, desktop computer 1306, laptop computer 1308, and/or automobile computer system 1310 may communicate. Nodes 1302 may communicate with one another. They may be grouped (not shown) physically or virtually, in one or more networks, such as Private, Community, Public, or Hybrid clouds as described hereinabove, or a combination thereof. This allows cloud computing environment 1300 to offer infrastructure, platforms and/or software as services for which a cloud consumer does not need to maintain resources on a local computing device. It is understood that the types of computing devices 1304-1310 shown in FIG. 13 are intended to be illustrative only and that computing nodes 1302 and cloud computing environment 1300 can communicate with any type of computerized device over any type of network and/or network addressable connection (e.g., using a web browser).

Figure 14:
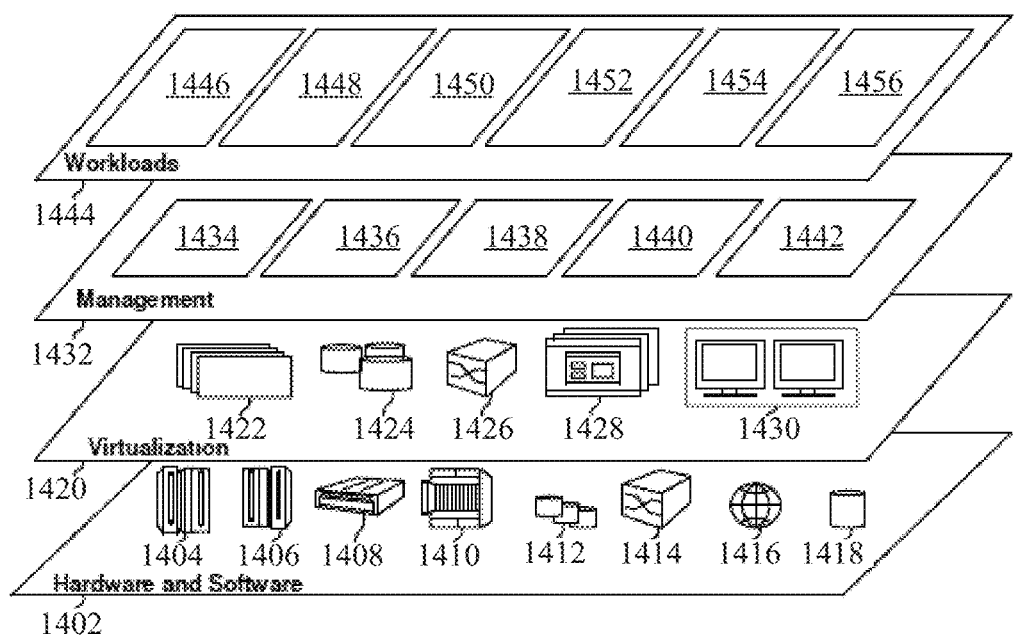
FIG. 14 depicts abstraction model layers in accordance with one or more embodiments described herein.

Referring now to FIG. 14, a set of functional abstraction layers provided by cloud computing environment 1300 (FIG. 13) is shown. Repetitive description of like elements employed in other embodiments described herein is omitted for sake of brevity. It should be understood in advance that the components, layers, and functions shown in FIG. 14 are intended to be illustrative only and embodiments of the invention are not limited thereto. As depicted, the following layers and corresponding functions are provided.

Hardware and software layer 1402 includes hardware and software components. Examples of hardware components include: mainframes 1404; RISC (Reduced Instruction Set Computer) architecture based servers 1406; servers 1408; blade servers 1410; storage devices 1412; and networks and networking components 1414. In some embodiments, software components include network application server software 1416 and database software 1418.

Virtualization layer 1420 provides an abstraction layer from which the following examples of virtual entities may be provided: virtual servers 1422; virtual storage 1424; virtual networks 1426, including virtual private networks; virtual applications and operating systems 1428; and virtual clients 1430.

In one example, management layer 1432 may provide the functions described below. Resource provisioning 1434 provides dynamic procurement of computing resources and other resources that are utilized to perform tasks within the cloud computing environment. Metering and Pricing 1436 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1438 provides access to the cloud computing environment for consumers and system administrators. Service level management 1440 provides cloud computing resource allocation and management such that required service levels are met. Service Level Agreement (SLA) planning and fulfillment 1442 provide pre-arrangement for, and procurement of, cloud computing resources for which a future requirement is anticipated in accordance with an SLA.

Workloads layer 1444 provides examples of functionality for which the cloud computing environment may be utilized. Examples of workloads and functions which may be provided from this layer include: mapping and navigation 1446; software development and lifecycle management 1448; virtual classroom education delivery 1450; data analytics processing 1452; transaction processing 1454; and logic gate placement analyzing 1456. Various embodiments of the present invention can utilize the cloud computing environment described with reference to FIGS. 13 and 14 to analyze one or more periodic circuit row configurations 100 to determine the functional placement of one or more logic gates.

The present invention may be a system, a method, and/or a computer program product at any possible technical detail level of integration. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware based systems that perform the specified functions or acts or carry out combinations of special purpose hardware and computer instructions.

Figure 15:
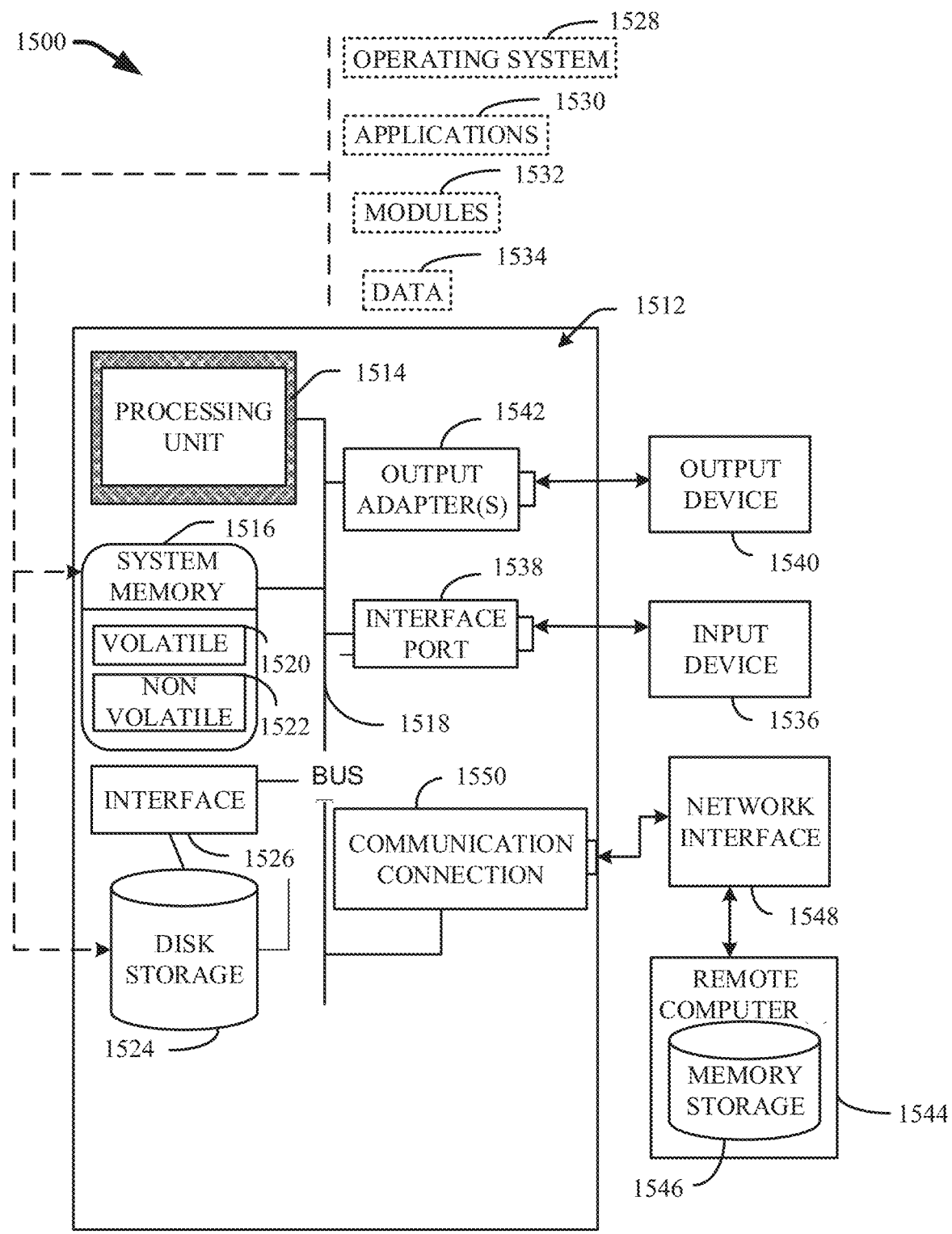
FIG. 15 illustrates a block diagram of an example, non-limiting operating environment in which one or more embodiments described herein can be facilitated.

In order to provide a context for the various aspects of the disclosed subject matter, FIG. 15 as well as the following discussion are intended to provide a general description of a suitable environment in which the various aspects of the disclosed subject matter can be implemented. FIG. 15 illustrates a block diagram of an example, non-limiting operating environment in which one or more embodiments described herein can be facilitated. Repetitive description of like elements employed in other embodiments described herein is omitted for sake of brevity. With reference to FIG. 15, a suitable operating environment 1500 for implementing various aspects of this disclosure can include a computer 1512. The computer 1512 can also include a processing unit 1514, a system memory 1516, and a system bus 1518. The system bus 1518 can operably couple system components including, but not limited to, the system memory 1516 to the processing unit 1514. The processing unit 1514 can be any of various available processors. Dual microprocessors and other multiprocessor architectures also can be employed as the processing unit 1514. The system bus 1518 can be any of several types of bus structures including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire, and Small Computer Systems Interface (SCSI). The system memory 1516 can also include volatile memory 1520 and nonvolatile memory 1522. The basic input/output system (BIOS), containing the basic routines to transfer information between elements within the computer 1512, such as during start-up, can be stored in nonvolatile memory 1522. By way of illustration, and not limitation, nonvolatile memory 1522 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1520 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1512 can also include removable/non-removable, volatile/non-volatile computer storage media. FIG. 15 illustrates, for example, a disk storage 1524. Disk storage 1524 can also include, but is not limited to, devices like a magnetic disk drive, floppy disk drive, tape drive, Jaz drive, Zip drive, LS-100 drive, flash memory card, or memory stick. The disk storage 1524 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1524 to the system bus 1518, a removable or non-removable interface can be used, such as interface 1526. FIG. 15 also depicts software that can act as an intermediary between users and the basic computer resources described in the suitable operating environment 1500. Such software can also include, for example, an operating system 1528. Operating system 1528, which can be stored on disk storage 1524, acts to control and allocate resources of the computer 1512. System applications 1530 can take advantage of the management of resources by operating system 1528 through program modules 1532 and program data 1534, e.g., stored either in system memory 1516 or on disk storage 1524. It is to be appreciated that this disclosure can be implemented with various operating systems or combinations of operating systems. A user enters commands or information into the computer 1512 through one or more input devices 1536. Input devices 1536 can include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices can connect to the processing unit 1514 through the system bus 1518 via one or more interface ports 1538. The one or more Interface ports 1538 can include, for example, a serial port, a parallel port, a game port, and a universal serial bus (USB). One or more output devices 1540 can use some of the same type of ports as input device 1536. Thus, for example, a USB port can be used to provide input to computer 1512, and to output information from computer 1512 to an output device 1540. Output adapter 1542 can be provided to illustrate that there are some output devices 1540 like monitors, speakers, and printers, among other output devices 1540, which require special adapters. The output adapters 1542 can include, by way of illustration and not limitation, video and sound cards that provide a means of connection between the output device 1540 and the system bus 1518. It should be noted that other devices and/or systems of devices provide both input and output capabilities such as one or more remote computers 1544.

Computer 1512 can operate in a networked environment using logical connections to one or more remote computers, such as remote computer 1544. The remote computer 1544 can be a computer, a server, a router, a network PC, a workstation, a microprocessor based appliance, a peer device or other common network node and the like, and typically can also include many or all of the elements described relative to computer 1512. For purposes of brevity, only a memory storage device 1546 is illustrated with remote computer 1544. Remote computer 1544 can be logically connected to computer 1512 through a network interface 1548 and then physically connected via communication connection 1550. Further, operation can be distributed across multiple (local and remote) systems. Network interface 1548 can encompass wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). One or more communication connections 1550 refers to the hardware/software employed to connect the network interface 1548 to the system bus 1518. While communication connection 1550 is shown for illustrative clarity inside computer 1512, it can also be external to computer 1512. The hardware/software for connection to the network interface 1548 can also include, for exemplary purposes only, internal and external technologies such as, modems including regular telephone grade modems, cable modems and DSL modems, ISDN adapters, and Ethernet cards.

Embodiments of the present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device including, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components including a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a memory that stores computer executable components; and
   a processor that executes the computer executable components stored in the memory, wherein the computer executable components comprise:
      an optimization component, operatively coupled to the processor, that determines functional placement of a logic gate in a self-aligned double patterning process that forms a periodic circuit row configuration, wherein the optimization component comprises:
         a swap component that determines whether the logic gate is placed, by the self-aligned double patterning process, to a functional circuit row of the periodic circuit row configuration based on an operation constraint of the logic gate.

2. The system of claim 1, wherein the periodic circuit row configuration comprises a first circuit row and a second circuit row, and wherein a first thickness of a first wire track comprised within the first circuit row is different than a second thickness of a second wire track comprised within the second circuit row.

3. The system of claim 1, wherein the operation constraint defines the functional placement of the logic gate, and wherein the operation constraint is based on the first thickness, and wherein the functional placement of the logic gate is on the first circuit row based on the first thickness.

4. The system of claim 3, wherein the functional placement is further based on a size of the logic gate and an amount of available space on the first circuit row.

5. The system of claim 1, wherein the optimization component determines the functional placement using a minimum cost maximum flow algorithm.

6. The system of claim 1, wherein the operation constraint is based on the first thickness.

7. The system of claim 1, wherein a second logic gate is located on the functional circuit row, wherein the swap component replaces the second logic gate with the logic gate based on the swap component determining that the logic gate is not placed on the functional circuit row, and wherein the second logic gate has a first width value that is no greater than a second width value of the logic gate.

8. The system of claim 7, wherein the optimization component further comprises:
   an assignment component that relocates the second logic gate replaced by the swap component to a position in the periodic circuit row configuration based on a second operation constraint of the second logic gate, wherein the second operation constraint is based on the first thickness.

9. The system of claim 1, wherein a plurality of second logic gates are located on the functional circuit row, wherein the swap component replaces the plurality of second logic gates with the logic gate based on the swap component determining that the logic gate is not placed on the functional circuit row, and wherein the plurality of second logic gates collectively have a first width value that is no greater than a second width value of the logic gate.

10. A computer-implemented method, comprising:
    determining, by a system operatively coupled to a processor, functional placement of a logic gate in a self-aligned double patterning process that forms a periodic circuit row configuration, wherein the periodic circuit row configuration comprises a first circuit row and a second circuit row, and wherein a first thickness of a first wire track comprised within the first circuit row is different than a second thickness of a second wire track comprised within the second circuit row; and
    determining, by the system, whether the logic gate is placed, during the self-aligned double patterning process, to a functional circuit row of the periodic circuit row configuration based on an operation constraint of the logic gate.

11. The computer-implemented method of claim 10, wherein the functional placement of the logic gate is on the first circuit row based on the operation constraint of the logic gate, and wherein the operation constraint is based on the first thickness.

12. The computer-implemented method of claim 11, wherein the functional placement is further based on a size of the logic gate and an amount of available space on the first circuit row.

13. The computer-implemented method of claim 10, wherein the determining comprises determining the functional placement using a minimum cost maximum flow algorithm.

14. The computer-implemented method of claim 10, wherein a second logic gate is located on the functional circuit row, and wherein the computer-implemented method further comprises:
   replacing, by the system, the second logic gate with the logic gate based on determining that the logic gate is not placed on the functional circuit row, and wherein the second logic gate has a first width value that is no greater than a second width value of the logic gate.

15. A computer program product that autonomously optimizes placement of a logic gate, the computer program product comprising a computer readable storage medium having program instructions embodied therewith, the program instructions executable by a processor to cause the processor to:
   determine, by a system operatively coupled to the processor, functional placement of the logic gate in a self-aligned double patterning process that forms a periodic circuit row configuration, wherein the periodic circuit row configuration comprises a first circuit row and a second circuit row, and wherein a first thickness of a first wire track comprised within the first circuit row is different than a second thickness of a second wire track comprised within the second circuit row; and
   determine, by the system, whether the logic gate is placed, during the self-aligned double patterning process, to a functional circuit row of the periodic circuit row configuration based on an operation constraint of the logic gate.

16. The computer program product of claim 15, wherein the program instructions further cause the processor to:
   determine, by the system, the functional placement using a minimum cost maximum flow algorithm.

17. The computer program product of claim 15, wherein a second logic gate is located on the functional circuit row, and wherein the program instructions further cause the processor to:
   replace, by the system, the second logic gate with the logic gate based on determining that the logic gate is not placed on the functional circuit row, and wherein the second logic gate has a first width value that is no greater than a second width value of the logic gate.

18. The computer program product of claim 15, wherein the functional placement of the logic gate is on the first circuit row based on an operation constraint of the logic gate, and wherein the operation constraint is based on the first thickness.

19. The computer program product of claim 18, wherein the functional placement is further based on a size of the logic gate and an amount of available space on the first circuit row.

20. The computer program product of claim 15, wherein a plurality of second logic gates are located on the functional circuit row, and wherein the program instructions further cause the processor to:
   replace, by the system, the plurality of second logic gates with the logic gate based on the swap component determining that the logic gate is not placed on the functional circuit row, and wherein the plurality of second logic gates collectively have a first width value that is no greater than a second width value of the logic gate.

* * * * *